(12) United States Patent
Hadley et al.

(10) Patent No.: US 7,551,141 B1
(45) Date of Patent: Jun. 23, 2009

(54) RFID STRAP CAPACITIVELY COUPLED AND METHOD OF MAKING SAME

(75) Inventors: Mark A. Hadley, Newark, CA (US); Curt L. Carrender, Morgan Hill, CA (US); John Stephen Smith, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 465 days.

(21) Appl. No.: 11/269,305

(22) Filed: Nov. 7, 2005

Related U.S. Application Data

(63) Continuation-in-part of application No. 11/159,550, filed on Jun. 22, 2005.

(60) Provisional application No. 60/626,241, filed on Nov. 8, 2004.

(51) Int. Cl.
*H01Q 1/38* (2006.01)
*H01Q 1/40* (2006.01)

(52) U.S. Cl. .................. 343/700 MS; 343/873

(58) Field of Classification Search .......... 343/700 MS, 343/741, 742, 867, 873
See application file for complete search history.

(56) References Cited

U.S. PATENT DOCUMENTS

| | | |
|---|---|---|
| 4,670,770 A | 6/1987 | Tai |
| 4,818,855 A | 4/1989 | Mongeon et al. |
| 4,857,893 A | 8/1989 | Carroll |
| 4,937,653 A | 6/1990 | Blonder et al. |
| 4,990,462 A | 2/1991 | Sliwa, Jr. et al. |
| 5,008,213 A | 4/1991 | Kolesar et al. |
| 5,032,896 A | 7/1991 | Little et al. |
| 5,048,179 A | 9/1991 | Shindo et al. |
| 5,083,697 A | 1/1992 | Difrancesco |
| 5,099,227 A | 3/1992 | Geiszler et al. |
| 5,138,436 A | 8/1992 | Koepf et al. |

(Continued)

FOREIGN PATENT DOCUMENTS

DE 199 29 610 C1 10/2000

(Continued)

OTHER PUBLICATIONS

PCT International Written Opinion, PCT Application No. PCT/US03/02115 (4 pages).

(Continued)

*Primary Examiner*—Shih-Chao Chen
(74) *Attorney, Agent, or Firm*—Blakely, Sokoloff, Taylor & Zafman LLP

(57) ABSTRACT

An electronic assembly with integrated circuit capacitively coupled to antenna. The electronic assembly includes a strap assembly and an antenna assembly. The antenna assembly includes a first substrate and antenna elements. The strap assembly includes a second substrate and an integrated circuit embedded within the second substrate and substantially flush with a surface of the second substrate. Interconnections are formed to the integrated circuit. The interconnections are formed on the surface of the second substrate. The antenna assembly and the strap assembly are affixed to one another with the surface of the second substrate facing the antenna elements. The antenna elements capacitively couples to the integrated circuit through the interconnections with no direct contact. A non-conductive layer is disposed between the antenna elements and the interconnections providing the capacitive coupling.

27 Claims, 17 Drawing Sheets

U.S. PATENT DOCUMENTS

| | | |
|---|---|---|
| 5,188,984 A | 2/1993 | Nischiguchi |
| 5,205,032 A | 4/1993 | Kuroda et al. |
| 5,212,625 A | 5/1993 | van Andel et al. |
| 5,221,831 A | 6/1993 | Geiszler |
| D343,261 S | 1/1994 | Eberhardt |
| 5,298,685 A | 3/1994 | Bindra et al. |
| 5,353,498 A | 10/1994 | Fillion et al. |
| D353,343 S | 12/1994 | Eberhardt |
| 5,378,880 A | 1/1995 | Eberhardt |
| 5,382,784 A | 1/1995 | Eberhardt |
| 5,382,952 A | 1/1995 | Miller |
| 5,420,757 A | 5/1995 | Eberhardt et al. |
| 5,422,513 A | 6/1995 | Marcinkiewicz et al. |
| 5,430,441 A | 7/1995 | Bickley et al. |
| 5,435,057 A | 7/1995 | Bindra et al. |
| 5,444,223 A | 8/1995 | Blama |
| RE35,119 E | 12/1995 | Blonder |
| 5,514,613 A | 5/1996 | Santadrea et al. |
| 5,517,752 A | 5/1996 | Sakata et al. |
| 5,528,222 A | 6/1996 | Moskowitz et al. |
| 5,545,291 A | 8/1996 | Smith et al. |
| 5,556,441 A | 9/1996 | Courtwright |
| 5,557,470 A | 9/1996 | Shibayama |
| 5,565,846 A | 10/1996 | Geiszler et al. |
| 5,574,470 A | 11/1996 | de Vall |
| D378,578 S | 3/1997 | Eberhardt |
| 5,682,143 A | 10/1997 | Brady et al. |
| 5,707,902 A | 1/1998 | Chang et al. |
| 5,708,419 A | 1/1998 | Isaacson et al. |
| 5,715,594 A | 2/1998 | Patterson et al. |
| 5,745,984 A | 5/1998 | Cole, Jr. et al. |
| 5,754,110 A | 5/1998 | Appalucci et al. |
| 5,779,839 A | 7/1998 | Tuttle et al. |
| 5,783,856 A | 7/1998 | Smith et al. |
| 5,798,050 A | 8/1998 | Gaynes et al. |
| 5,818,348 A | 10/1998 | Walczak et al. |
| 5,824,186 A | 10/1998 | Smith et al. |
| 5,904,545 A | 5/1999 | Smith et al. |
| 5,910,770 A | 6/1999 | Ohara |
| 5,914,862 A | 6/1999 | Ferguson et al. |
| 5,995,006 A | 11/1999 | Walsh |
| 6,018,299 A | 1/2000 | Eberhardt |
| 6,019,284 A | 2/2000 | Freeman et al. |
| 6,031,450 A | 2/2000 | Huang |
| 6,040,773 A | 3/2000 | Vega et al. |
| 6,064,116 A | 5/2000 | Akram |
| 6,078,791 A | 6/2000 | Tuttle et al. |
| 6,091,332 A | 7/2000 | Eberhardt et al. |
| 6,094,138 A | 7/2000 | Eberhardt et al. |
| 6,094,173 A | 7/2000 | Nylander |
| 6,100,804 A | 8/2000 | Brady et al. |
| 6,107,920 A | 8/2000 | Eberhardt et al. |
| 6,122,492 A | 9/2000 | Sears |
| 6,133,833 A | 10/2000 | Sidlauskas et al. |
| 6,133,835 A | 10/2000 | De Leeuw et al. |
| 6,134,130 A | 10/2000 | Connell et al. |
| 6,147,605 A | 11/2000 | Vega et al. |
| 6,147,662 A | 11/2000 | Grabau et al. |
| 6,164,551 A | 12/2000 | Altwasser |
| 6,181,287 B1 | 1/2001 | Beigel |
| 6,189,208 B1 | 2/2001 | Estes et al. |
| 6,194,119 B1 | 2/2001 | Wolk et al. |
| 6,195,858 B1 | 3/2001 | Ferguson et al. |
| 6,204,163 B1 | 3/2001 | Panchou et al. |
| 6,206,282 B1 | 3/2001 | Hayes, Sr. et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,229,442 B1 | 5/2001 | Rolin et al. |
| 6,236,316 B1 | 5/2001 | Eberhardt et al. |
| 6,246,327 B1 | 6/2001 | Eberhardt |
| 6,252,508 B1 | 6/2001 | Vega et al. |
| 6,262,692 B1 | 7/2001 | Babb |
| 6,265,977 B1 | 7/2001 | Vega et al. |
| 6,268,796 B1 | 7/2001 | Gnadinger et al. |
| 6,274,391 B1 | 8/2001 | Wachtler et al. |
| 6,274,508 B1 | 8/2001 | Jacobsen et al. |
| 6,275,156 B1 | 8/2001 | Rasband |
| 6,275,681 B1 | 8/2001 | Vega et al. |
| 6,281,038 B1 | 8/2001 | Jacobsen et al. |
| 6,282,407 B1 | 8/2001 | Vega et al. |
| 6,291,896 B1 | 9/2001 | Smith |
| 6,297,072 B1 | 10/2001 | Tilmans et al. |
| 6,309,912 B1 | 10/2001 | Chiou et al. |
| 6,313,747 B2 | 11/2001 | Imaichi et al. |
| 6,320,543 B1 | 11/2001 | Ohata et al. |
| 6,320,753 B1 | 11/2001 | Launay |
| 6,329,917 B1 | 12/2001 | Leonard |
| 6,357,005 B1 | 3/2002 | Devaux et al. |
| 6,366,468 B1 | 4/2002 | Pan |
| 6,384,425 B1 | 5/2002 | Huber et al. |
| 6,392,213 B1 | 5/2002 | Martorana et al. |
| 6,410,415 B1 | 6/2002 | Estes et al. |
| 6,417,025 B1 | 7/2002 | Gengel et al. |
| 6,420,266 B1 | 7/2002 | Smith et al. |
| 6,448,109 B1 | 9/2002 | Karpman |
| 6,528,351 B1 | 3/2003 | Nathan et al. |
| 6,530,649 B1 | 3/2003 | Pan |
| 6,536,674 B2 | 3/2003 | Kayanakis et al. |
| 6,542,444 B1 | 4/2003 | Rutsche |
| 6,559,666 B2 | 5/2003 | Bernier et al. |
| 6,590,346 B1 | 7/2003 | Hadley et al. |
| 6,606,247 B2 | 8/2003 | Credelle et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,690,598 B2 | 2/2004 | Oguchi et al. |
| 6,696,785 B2 | 2/2004 | Shimoda et al. |
| 6,727,970 B2 | 4/2004 | Grace et al. |
| 6,779,733 B2 | 8/2004 | Akita et al. |
| 6,780,696 B1 | 8/2004 | Schatz |
| 6,794,221 B2 | 9/2004 | Sayyah |
| 6,816,380 B2 | 11/2004 | Credelle et al. |
| 6,841,419 B2 | 1/2005 | Akita et al. |
| 6,844,673 B1 | 1/2005 | Bernkopf |
| 6,853,087 B2 | 2/2005 | Neuhaus et al. |
| 6,856,086 B2 | 2/2005 | Grace et al. |
| 6,863,219 B1 | 3/2005 | Jacobsen et al. |
| 6,864,570 B2 | 3/2005 | Smith |
| 6,867,983 B2 | 3/2005 | Liu et al. |
| 6,908,295 B2 | 6/2005 | Thielman et al. |
| 6,919,680 B2 | 7/2005 | Shimoda et al. |
| 6,957,481 B1 | 10/2005 | Patrice |
| 7,109,867 B2 | 9/2006 | Forster |
| 7,214,569 B2 * | 5/2007 | Swindlehurst et al. ....... 438/125 |
| 7,244,326 B2 * | 7/2007 | Craig et al. ................. 156/234 |
| 7,261,829 B2 | 8/2007 | Efferenn et al. |
| 7,324,061 B1 * | 1/2008 | Hadley ....................... 323/873 |
| 7,353,598 B2 * | 4/2008 | Craig et al. .................... 29/846 |
| 2001/0000631 A1 | 5/2001 | Zandman et al. |
| 2001/0031514 A1 | 10/2001 | Smith |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith |
| 2002/0114587 A1 | 8/2002 | Golwaker et al. |
| 2002/0127864 A1 | 9/2002 | Smith et al. |
| 2002/0149107 A1 | 10/2002 | Chang et al. |
| 2003/0029921 A1 | 2/2003 | Akita et al. |
| 2003/0034400 A1 | 2/2003 | Han et al. |

| | | | |
|---|---|---|---|
| 2003/0054881 A1 | 3/2003 | Hedrick et al. | |
| 2003/0136503 A1 | 7/2003 | Green | |
| 2003/0148555 A1 | 8/2003 | Akita et al. | |
| 2003/0232174 A1 | 12/2003 | Chang et al. | |
| 2004/0026754 A1 | 2/2004 | Liu et al. | |
| 2004/0037053 A1 | 2/2004 | Akita et al. | |
| 2004/0052202 A1 | 3/2004 | Brollier | |
| 2004/0052203 A1 | 3/2004 | Brollier | |
| 2004/0054594 A1 | 3/2004 | Forester et al. | |
| 2004/0183182 A1 | 9/2004 | Swindlehurst et al. | |
| 2005/0040994 A1 | 2/2005 | Mazoki et al. | |
| 2006/0012482 A1 | 1/2006 | Zalud et al. | |
| 2006/0094168 A1 | 5/2006 | Hoffman et al. | |
| 2006/0118229 A1 | 6/2006 | Ohashi et al. | |

FOREIGN PATENT DOCUMENTS

| | | |
|---|---|---|
| EP | 0 992 939 A1 | 4/2000 |
| EP | 1 014 302 A1 | 6/2000 |
| EP | 1167 068 | 1/2002 |
| EP | 1381080 A2 | 1/2004 |
| JP | 11353439 A | 12/1999 |
| JP | 2001175837 A | 6/2001 |
| JP | 2003242471 | 8/2003 |
| WO | WO 99/41701 A2 | 8/1999 |
| WO | WO 00/52109 | 9/2000 |
| WO | WO 01/33621 A2 | 5/2001 |
| WO | WO 01/75789 A1 | 10/2001 |
| WO | WO 02/097724 A1 | 12/2002 |
| WO | WO 03/030245 | 4/2003 |
| WO | WO 03/063211 | 7/2003 |
| WO | WO 2004/097731 A2 | 11/2004 |

OTHER PUBLICATIONS

PCT International Search Report for PCT Application No. PCT/US2005/002534. Mailed on Nov. 11, 2005, (7 pages).

PCT Written Opinion Report for PCT Application No. PCT/US2005/002534. Mailed on Nov. 11, 2005, (7 pages).

PCT Notification of Transmittal of International Preliminary Examination Report for PCT International Application No. US02/16474, mailed Jul. 21, 2005, (5 pages).

Kriebel, Frank (2005). RFID Chip and Tag Assembly challenges: Low Cost RFID IC Packaging and Assembly Workshop, Nov. 14, 2005, Munich, Germany. (12pgs).

PCT Notification Concerning Transmittal of International Preliminary Report on Patentability (Chapter 1 of the Patent Cooperation Treaty) Intl. Application No. PCT/US2005/040410, Mailed on May 18, 2007 (21 pages).

Curtis, C. et al. "Metallizations by Direct-Write Inkjet Printing" *National Renewable Energy Laboratory*, NREL/CP-520-31020, Golden Colorado, Oct. 2001 (pp. 1-6).

Derby B., "Direct Write of Functional materials by Ink-Jet Printing" *Manchester Materials Science Center*, The University of Manchester, (pp. 1-19).

Pique, A., et al. "Direct Writing of Electronic and Sensor Materials Using a Laser Transfer Technique" *Material Research Society*, J. Mater. Res., vol. 15, No. 9, Sep. 2000, (pp. 1872-1875).

* cited by examiner

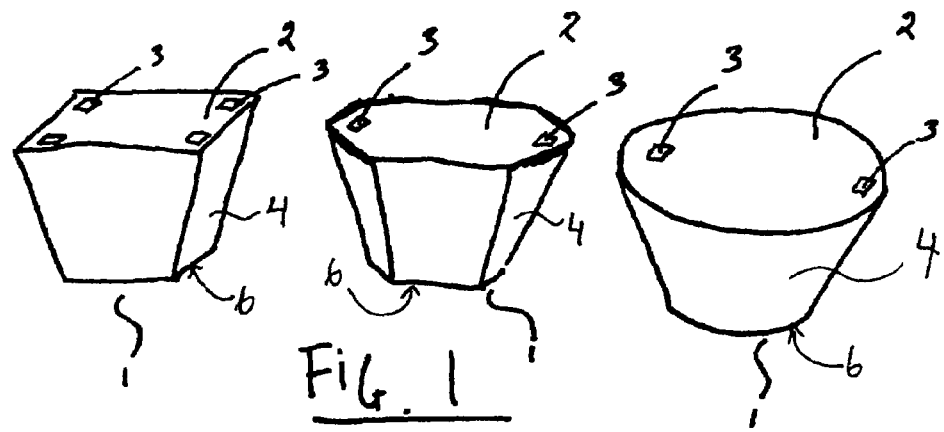
FIG. 1
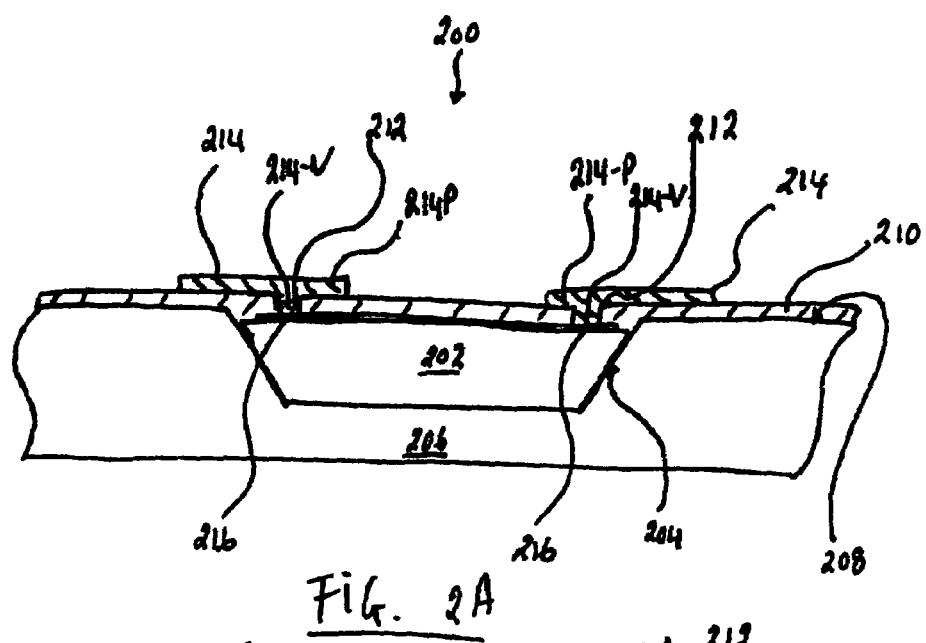
FIG. 2A
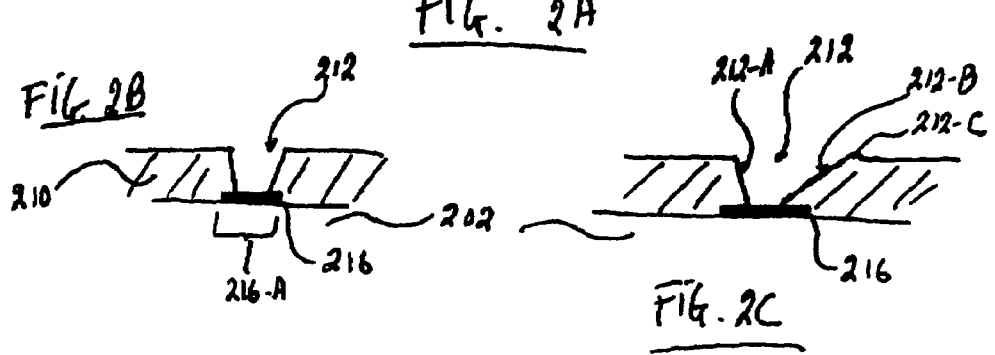
FIG. 2B
FIG. 2C

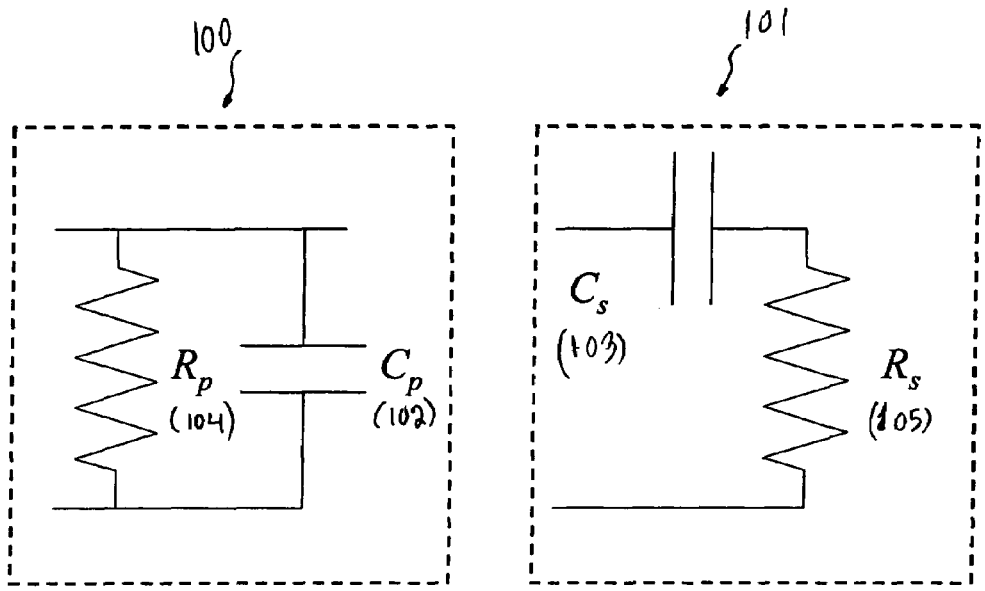
FIGURE 8  FIGURE 9
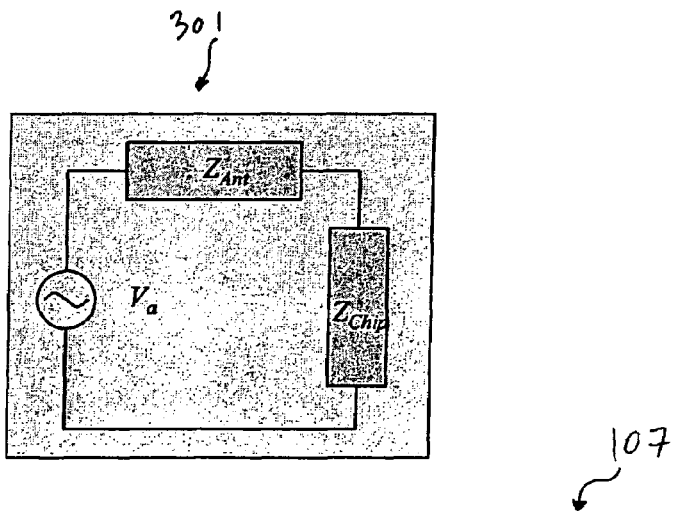
FIGURE 10A
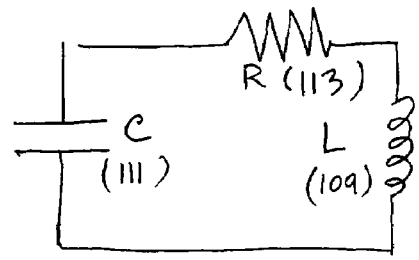
FIGURE 10B

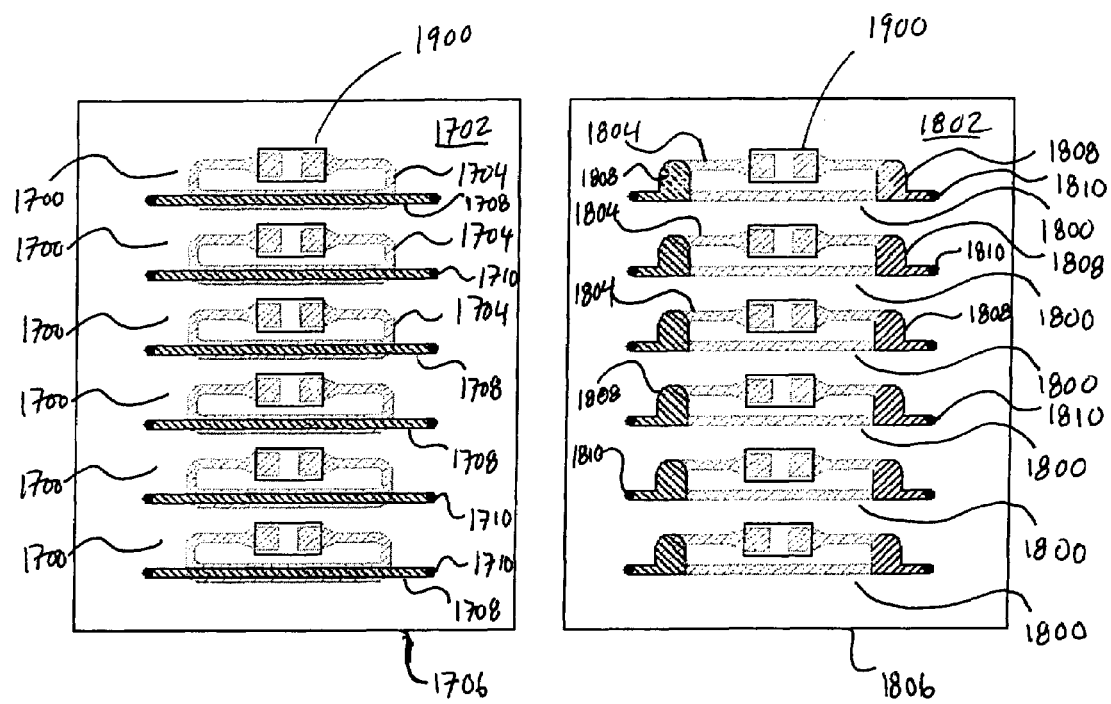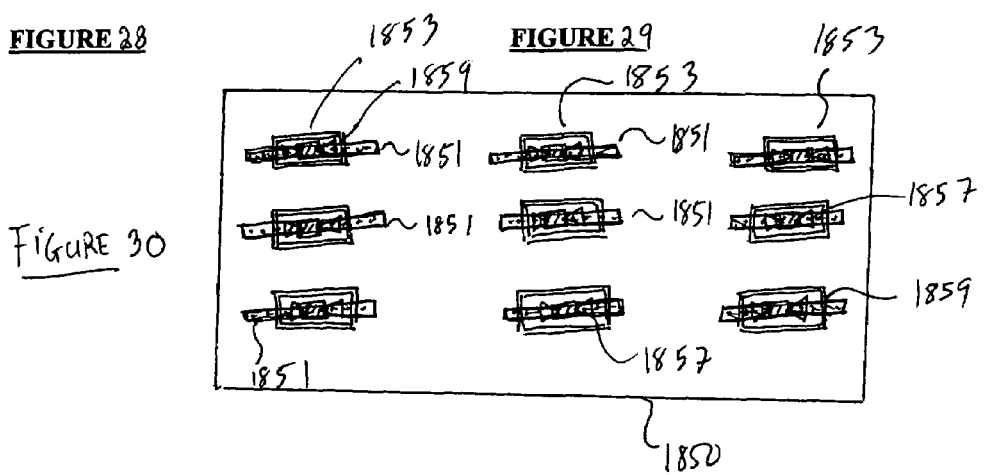

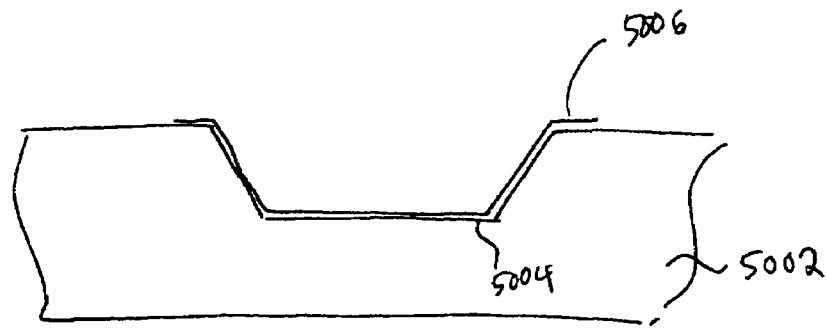
FIG. 31A
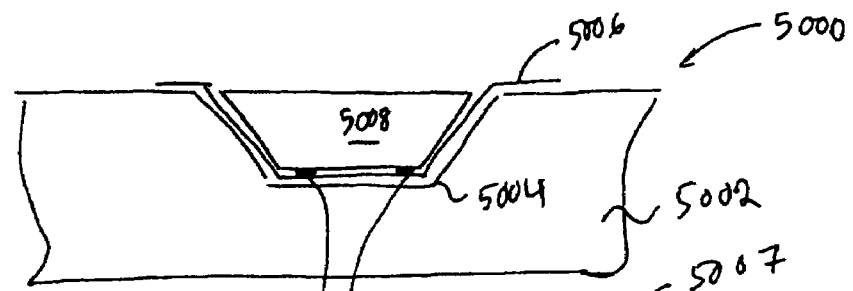
FIG. 31B
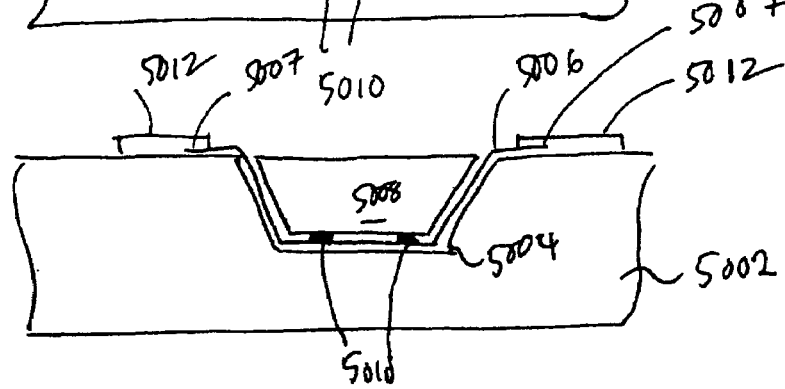
FIG. 31C
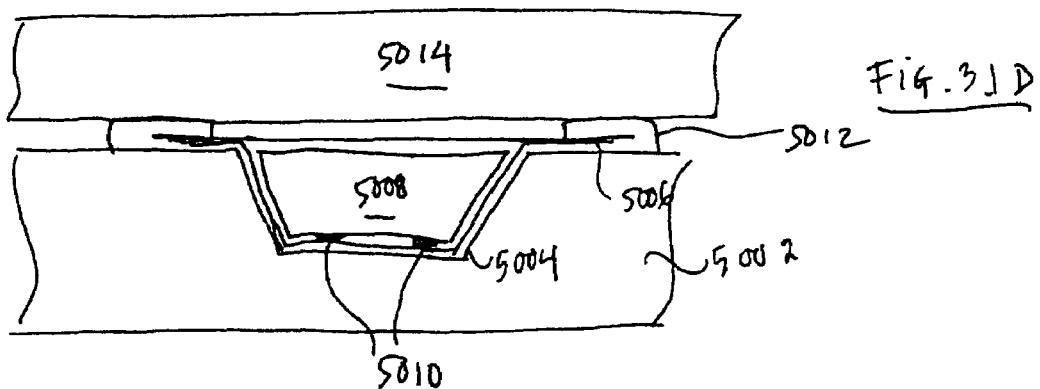
FIG. 31D

US 7,551,141 B1

RFID STRAP CAPACITIVELY COUPLED AND METHOD OF MAKING SAME

RELATED APPLICATION

This application is related to and claims the benefit of U.S. Provisional Patent application Ser. No. 60/626,241 filed Nov. 8, 2004, which is hereby incorporated by reference in its entirety. This application is also related to co-pending U.S. patent application Ser. Nos. 11/268,837 and 11/269,400 filed on the same day with this application, Nov. 7, 2005, and which are hereby incorporated by reference in their entireties. This application is also a continuation in part of U.S. application Ser. No. 11/159,550 filed Jun. 22, 2005, which is hereby incorporated by reference in its entirety.

GOVERNMENT RIGHT TO APPLICATION

At least certain aspects of the invention described herein were made with U.S. Government support under a federal contract with a contract number H94003-04-2-0406. Accordingly, the Government has certain rights in those aspects of the invention.

FIELD

The present invention relates generally to the field of fabricating electronic devices with small functional elements deposited in a substrate.

BACKGROUND

There are many examples of functional blocks or components that can provide, produce, or detect electromagnetic or electronic signals or other characteristics. The functional blocks are typically objects, microstructures, or microelements with integrated circuits built therein or thereon. These functional blocks have many applications and uses.

Functional components have also been used to make other electronic devices. One example of such use is that of a radio frequency (RF) identification tag (RFID tag) which contains a functional block or several blocks each having a necessary circuit element. Information is recorded into these blocks, which can be remotely communicated to a base station. Typically, in response to a coded RF signal received from the base station, the RFID reflects and/or modulates the incident RF carrier back to the base station thereby transferring the information.

Such RFID tags are being incorporated into many commercial items for tracking and authenticating.

Functional components have been applied to make many electronic devices, for instance, the making of microprocessors, memories, power transistors, super capacitors, displays, x-ray detector panels, solar cell arrays, memory arrays, long wavelength detector arrays, phased array antennas, RFID tags, chemical sensors, electromagnetic radiation sensors, thermal sensors, pressure sensors, or the like. The growth for the use of functional components, however, has been inhibited by the high cost of assembling the functional components into substrates and fabricating final devices or end products that incorporate the functional components.

Often the assembling of these components requires complex and multiple processes thereby causing the price of the end product to be expensive. Furthermore, the manufacturing of these components is costly under the current method because of inefficient and wasteful uses of the technologies and the materials used to make these products.

For cost and form factor considerations, many electronic devices are being constructed with ever-smaller electronic components. In particular, devices like RFID transponders, electronic displays, active antennas, sensors, computational devices, and a number of wireless devices rely on integrated circuits (ICs) as small a 1 mm on a side, with pressure to decrease the size further. While the raw component cost of devices can decrease along with their size, assembly of the components into devices becomes more difficult and more costly as their size decreases. There is a need for technologies that enable the low-cost assembly of active components that are on the order of hundreds of microns on a side, or even smaller and making interconnections to these active components.

In order to interconnect very small RFID chips with antennas to form RFID tags, straps or "interposers" or carriers with the RFID chips formed therein are used to connect the RFID chips to the antennas. The interposers or carriers typically include conductive leads or pads (also sometimes referred to as pad conductors) that are electrically coupled to contact pads of the chips. These pads provide a larger effective electrical contact area than the RFID chips and alleviate some stringent alignment requirement when the interposers are coupled to the antennas. The larger area provided by the pads reduces the accuracy required for placement of chips during manufacture while still providing effective electrical connection. Currently, methods or structures of connecting the RFID chips to antennas still involve mechanical or physical interconnection between the interposers (hence the chips) and the antennas and thus, some alignments are still required. Furthermore, it is required that the antenna assemblies and the interposer assemblies be aligned to one another (interposers' pad conductors to antenna pads) for the completion of the RFID tags.

As demand for less expensive RFID tags increases, it is desirable to develop ways to manufacture and create RFID tags that involve simple and less expensive assembly.

SUMMARY

Embodiments of the present invention provide methods that can lead to efficient fabrications of an electronic assembly that incorporates a functional component or block.

In one aspect of the invention, a strap assembly is fabricated. One or more recessed receptor sites (regions) are formed into a strap substrate. One or more functional or integrated circuit blocks are deposited into the recessed receptor sites, for example, using a Fluidic Self-Assembly (FSA) process. Electrical interconnections are created to enable connection to the functional blocks. After the functional blocks are deposited into the respective receptor sites in the strap substrate and the necessary interconnections formed, the strap assembly is then attached to another substrate (device substrate), which may comprise a set of patterned or printed conductor (e.g., elements or parts of an antenna for an RFID device). A functional block in the strap assembly is interconnected to the conductor on the other substrate through capacitive coupling. Alternatively, a functional block in the strap assembly is interconnected to a resonator, which capacitively couples the functional block to the conductor on the other substrate.

To form the electrical interconnections, in one embodiment, a local printing system coupled with a guidance system is used to increase the resolution of the interconnections or dielectric layers. The guidance system also facilitate the alignment of the printing system with respect to registering appropriate and accurate printing locations. A print head is used for the local printing system. In one embodiment, the guidance system is coupled to the print head to further facilitates the alignment of the print head. One or more electrical contacts to the functional blocks can be formed using this local printing system. One or more dielectric layers can also be formed using this local printing system. The guidance system can be an optical system that recognizes features, alignment features, or marks on the strap substrate to provide alignment of a print head. An electrical, magnetic, or mechanical mechanism can also be used to provide improved alignment as well. A local printing system includes thermal jet printing, piezoelectric jet printing, acoustic jet printing, extrusion of a material (stencil printing), or other direct printing systems. It should be recognized that it is possible to group multiple local printing systems with multiple print heads, with each print head depositing a printed material, so that more than one region of a substrate can be printed on at the same time.

In another aspect of the invention, the guidance system is used to improve the registration for printing interconnections to and from functional blocks in strap assemblies. In another aspect of the invention, a combination of local printing system, laser cutting system, and a guidance system is used to repair bad circuit elements in the strap assembly (such as repairing faulty interconnections or faulty contact pads in the strap assembly. In one embodiment, a testing method, which could comprise an optical, electrical, or mechanical means, is used to determine areas of the strap substrate in which a portion or portions of the functional blocks, interconnections, or contacts pads are known to be, or suspected to be, faulty. A laser can be used to cut, deplete, or otherwise render the damaged area ready for a subsequent printing or deposition step, including the deposition of another integrated circuit element. The local printing system can be used to deposit new material to repair the particular components.

In another aspect of the invention, conductive elements are printed onto a receptor film suitable for use in an FSA process prior to the fluidic assembly process. In this way, electronic contacts can be printed down into the receptor film, which can then make contact with the integrated circuit after the FSA process. The FSA process is used to deposit the integrated circuit. Then, heat, pressure, or exposure to electromagnetic radiation may be used to help in making electrical contact between the integrated circuit and the conductive material in the receptor site, as well as to bind the integrated circuit into the site. Subsequent printing steps can be used to make further electrical contact to and from the integrated circuit, or to bind the integrated circuit into the receptor film. The integrated circuit is then capacitively or inductively coupled, or both, to another conductor on another substrate.

In another aspect of the invention, conductive, capacitive, resistive, resonator, or inductive elements are printed (e.g., using local printing) on or near a functional element used to assemble into an RFID device or a strap assembly. These conductive, capacitive, resistive, resonator, or inductive elements along with suitable conductive and dielectric materials can improve a performance of the RFID device. These elements may be printed in multiple layers and/or in multiple printing steps. Different printing techniques may be used to print different aspects of a particular functional device. The elements may be formed with any suitable forms such as coils, overlay, or lines. In another process, an RFID circuit element (functional element) assembled a substrate is tested for its performance, or for a relevant parameter such as its capacitance. Conductive or dielectric materials are then printed onto or near the RFID circuit element or a functional component embedded in a substrate to tune and perform its performance. In another aspect of this invention, diodes or transistors may be printed on or near the RFID circuit element, and used to affect the device performance, or to add additional functions to the RFID circuit element.

Related aspects of this invention follow. In particular, in the disclosure describing the use of capacitive coupling to connect an antenna to an RFID device, printing may be used to deposit the antenna, dielectric materials, or conductive materials to lead to the functional device.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings:

FIG. 1 illustrates an example of a functional component block;

FIGS. 8-9 illustrate examples of equivalent circuits of an RFID integrated circuit chip;

FIG. 10A illustrates an example of an equivalent circuit of an RFID integrated circuit chip coupled to an antenna;

FIG. 10B illustrates an example of an equivalent circuit of adding a resonator to an RFID integrated circuit chip;

FIGS. 28-30 illustrate exemplary embodiments of test boards that can be used to test a plurality of resonator assemblies through capacitive coupling or inductive coupling; and FIGS. 31A-31D illustrates exemplary embodiments with a conductive layer formed in a receptor region prior to a functional block being deposited into a substrate.

DETAILED DESCRIPTION

Figure 2D:
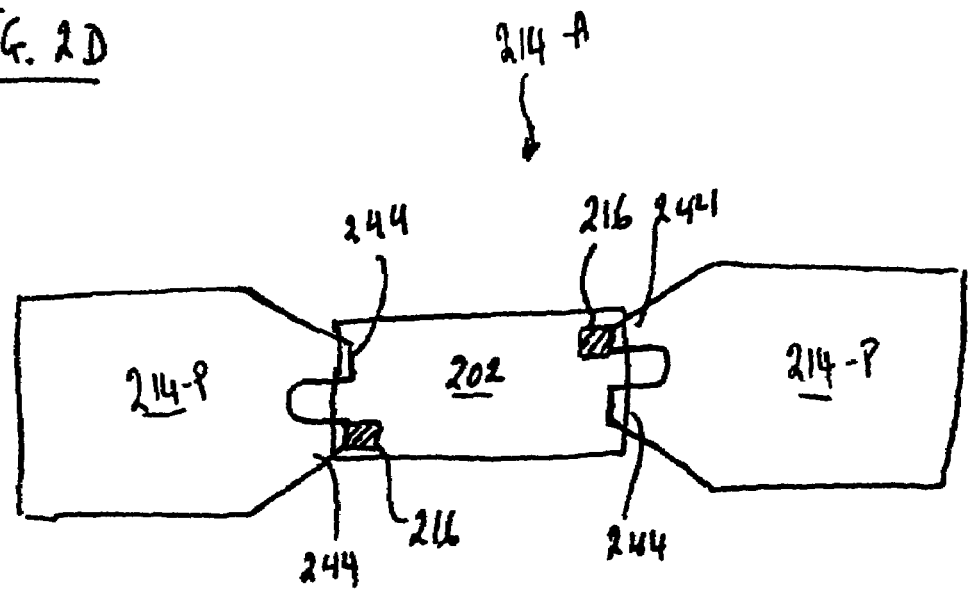
FIGS. 2D, 2E(a)-2E(b) and 2F illustrate exemplary embodiments of a conductive interconnect coupling to a functional block.

In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

Throughout the disclosure, a substrate with one or more functional blocks deposited therein can be referred to as a "strap assembly." A strap assembly typically includes an integrated circuit and interconnections as well as dielectric layers. The term "strap assembly" can also be used interchangeable with the term "interposer" or "interposer assembly."

Embodiments of the invention apply to both flexible and rigid substrates, and to both monolayer and multilayer substrates. One or more recessed regions are created in a substrate so that the substrate is able to receive one or more functional blocks. Typically the blocks are contained in a slurry, which is deposited onto the flexible substrate as is typically done in a Fluidic Self-Assembly (FSA) or robotic pick-and-place process. Although the blocks may be comprised of single crystal silicon or other like material, which makes the block rigid, the substrate may still be flexible because the size of these blocks (e.g., 650×500 μm or 850× 850 μm) is small, or significantly small, in comparison to the flexible substrate (e.g., 3×6 mm or larger). In some embodiments, the flexible substrate forms part of an RFID tag, a merchandise label, a packaging, a pharmaceutical label/seal, a currency (money), or a display backplane, to name a few example applications.

The overall manufacturing process of a strap assembly impacts the cost of the final device that incorporates the strap assembly. A strap assembly is typically coupled or attached to another device, such as an antenna. Alignment of the strap assembly over the other device needs to be done so that conductive elements are properly aligned with one another for a successful electrical interconnection. Many embodiments of the present invention minimize the complexity or need for rigid alignment requirements. Thus, strap assemblies can be supplied as labels (similar to postage stamp) which can then be stuck onto a surface having an antenna element with little or no rigid alignment since the electrical coupling is done capacitively or inductively, or both.

FIG. 1 illustrates exemplary embodiments of an object that is functional component block 1. The functional block 1 can have various shapes and sizes. Each functional block 1 has a top surface 2 upon which a circuit element is situated (not shown). The circuit element on the top surface 2 may be an ordinary integrated circuit (IC) for any particular function. Although not shown, the circuit element can be placed on the side surface 4 or the bottom surface 6 of the block 1. The IC may be designed to drive a pixel of a display. The IC may also be designed to receive power from another circuit, such as an antenna, and perform a particular function or functions for the operation of a passive RFID tag. Alternatively, the IC may be designed to receive power from an energy source (e.g. battery) for the operation of an active RFID tag. The functional block 1 also includes a contact pad 3 (one or more contact pads 3) to allow electrical interconnection to the circuit element on the block 1. The contact pads 3 can be placed on the top surface 2, the side surface 4, or the bottom surface 6 of the block 1.

The functional block 1 can have a trapezoidal, rectangular, square, cylinder, asymmetrical, or asymmetrical shape. The top of the block 1 is often (but need not be) wider than the bottom of the block 1. Each functional block 1 may be created from a host substrate and separated from the host substrate. Methods of making a functional block 1 are known in the art and for instance, can be found U.S. Pat. Nos. 5,783,856; 5,824,186; 5,904,545; 5,545,291; and 6,291,896, which are hereby incorporated by reference in their entireties.

FIG. 2A illustrates a cross-sectional view of an exemplary embodiment of an electronic assembly (or a strap assembly) 200. The assembly 200 can be part of or made to incorporate into a display device, a RFID tag, a merchandise label (a CD label), merchandise packaging/cover, a pharmaceutical label or bottle, etc. The assembly 200 can be attached to another substrate (e.g., a device substrate) that may have patterned, printed, or formed thereon a conductor or conductors. A functional block 202 is deposited in recessed region 204 of a substrate 206 to form the assembly 200. The functional block 202 can be the functional block 1 previously discussed. In one embodiment, the functional block 202 is a NanoBlock™ made by Alien Technology.

In one embodiment, once deposited, the functional block 202 is flush or is recessed below a surface 208 of the substrate 206. In one embodiment, the functional block 202 is recessed sufficiently below the surface 208 to provide sufficient space for electrical connection to the functional block 202. In one embodiment, the functional block 202 is deposited into the recessed region 204 using an FSA process. The surface 208 of the substrate 206 is the native surface of the substrate 206 before any deposition of any other materials on top of the surface 208. It is to be appreciated that the functional block 202 can be deposited to be flush against the surface 208, which is then covered by another film or be flush with the surface upon which subsequent interconnection resides, for example, flush with an additional layer formed on the surface 208. The substrate 206 may be a flexible substrate made out of plastic, fabric, metal, or some other suitable materials. In one embodiment, the substrate 206 is flexible. In one embodiment, the assembly 200 is flexible.

Also shown in FIG. 2A, a dielectric layer 210 is formed over the surface 208 and over the functional block 202. The dielectric layer 210 in many instances, also functions as a planarization layer as well as a layer that traps or keeps the functional block 202 in the recessed region 204. Vias 212 are also formed into the dielectric layer 210 to expose portions of the functional block 202. Typically, each of the exposed portions of the functional block 202 comprises a contact pad 216 that enables electrical interconnection to the functional block 202. In one embodiment, the functional block 202 includes two contact pads 216 placed on opposite sides and/or diagonal to each other. In such embodiments, the dielectric layer 210 has two vias 212, one for each contact pad 216. Each via 212 exposes some or all of the top area 216-A of the corresponding contact pad 216 (FIGS. 2B-2C). In one embodiment, as shown in FIG. 2B each via 212 has a diameter that is smaller than the top area 216-A of the corresponding contact pad 216. In some embodiment, the via 212 has a cone-like shape where the via 212 has a top diameter and a bottom diameter. The bottom diameter is smaller than the top diameter. In one embodiment, the bottom diameter is at least 20% smaller than the contact pad 216. Optimally, the diameter of the via 212 at the bottom should be no more than 80% of the width of the contact pad 216, which may be defined by the area 216A. Most optimally, it should be no more than 60% of the width of the contact pad 216, which may be defined by the area 216A. In one embodiment, the via 212 has a non-symmetrical cone-like shape in which one side of the via 212 has a flatter or gentler slope than the other side (FIG. 2C). As shown in FIG. 2C, the via 212 has two sides, 212-A and 212-B, in which the side 212-B has a more "gentle" or flatter slope than the side 212-A. In one embodiment, a small protrusion 212-C is formed on the side 212-B of the via 212. The configuration of the via 212 in accordance to the present embodiment helps the conductive material to more easily fill the via 212.

The dielectric film 210 can be deposited as described in previously referenced applications e.g., using a roll-to-roll process or a local printing. The dielectric film 210 contains at least one opening formed through the dielectric film for the via 212. Each via 212 enables the conductive interconnect 214 formed on the top of and into the dielectric film 210 to make electrical connection with a contact pad 216 on the functional block 202.

Each conductive interconnect 214 can be one conductor or two conductors joined together. The conductive interconnect 214 can be formed in a one-step process or a two-step process. When the conductive interconnect 21 is made of two (2) conductors, one conductor is referred to as a "via conductor" (214-V) since it fills the via 212. The other conductor is referred to a "pad conductor" (214-P) which sits on a portion of the dielectric layer 210 and connects or joins the via conductor 214-V.

Each via 212 in the dielectric film 210 is positioned over a contact pad 216, such that the via 212 enables interconnection from the contact pad 216 on the functional block 202 to the interconnect 214. In one embodiment, each via 212 is formed such that no dielectric material is present in the via 212.

In many embodiments, there are two (2) (or more) vias 212 created over each functional block 202 (e.g., 1, 3, 4, 5, or more vias). The number of vias 212 can be increased or decreased depending on the product. The number of vias 212 also depends on how many contact pads 216 are present in the functional block 202 or depending on how many electrical connections are needed. For example, many more dielectric vias may be needed for embodiments where the assembly 200 is incorporated into display driver or sensor applications. In one embodiment, there are two contact pads 216 on the functional block 202 and the contact pads are situated diagonally to each other. In such embodiment, the dielectric film 210 has two vias 212 which are also situated diagonally to each other over the corresponding contact pads 216.

In one embodiment, the dielectric film 210 has a thickness ranging from about 5 μm to about 60 μm. In another embodiment, the thickness of the dielectric film 210 is approximately less than 25 μm or less than 38 μm.

In one embodiment, the dielectric film 210 has an adhesive functionality to the side that is applied to the substrate 206. The adhesive functionality could be an inherent property of the dielectric material or its application process, or it could be due to an adhesive film that is applied to the side of the dielectric film 210 that comes in contact with the substrate 206. In embodiments where an adhesive film is used to provide the adhesive to the dielectric film 210, the adhesive film is non-conductive and can be processed to achieve the desired structure for the via 212. For example, the adhesive film may be photo imageable or laser drillable to allow the via 212 to be formed. A laser drillable adhesive film could be fabricated by using an adhesive that inherently absorbs UV light, or else by using an adhesive formulation that consists of a UV-absorbing species. A photo-imageable or laser-drillable adhesive might also enable direct electrical contact to the contact pad without an intermediate cleaning or de-scum process. If an adhesive film is used on the dielectric film 210, all of the dimensions listed for the dielectric film 210, including film thickness and via diameter, applies to the dielectric and adhesive film combined together.

In one embodiment, the dielectric film 210 has a coefficient of thermal expansion (CTE) that is closely matched to that of the substrate 206. Preferably, the CTE is within ±20 ppm/° C. of the CTE of the base material of the substrate 206, which is typically 50-70 ppm/° C., but can vary depending on the substrate. The proximity of the dielectric film CTE to the substrate film CTE is more important than the absolute value of the substrate film CTE. Suitable dielectric materials include, but are not limited to, polyimide, polyetherimide, liquid crystal polymer, and polyethylenenaphthalate.

In one embodiment, the vias 212 in the dielectric film 210 are formed over corner areas of the functional block 202. In one embodiment, the vias 212 are only formed over the corners of the functional blocks with the contact pads 216. Additionally, the dielectric film 210 may also be formed only in discrete or selected positions on or around the functional block 202 and around the area of the substrate 206 that has the functional block 202 deposited therein. When the dielectric film 210 is discretely or selectively formed, the vias 212 may not be necessary since the dielectric material may be selected to not form over the contact pads 216 to leave the contact pads 216 exposed.

A method that can be used for selectively or discretely forming the dielectric film 210 includes direct write, such as ink-jet, and laser assisted deposition, etc. Any of such method can also be done with the use of a guidance system that works cooperatively with registration marks provided on the substrate of better alignment of the printing locations. Such method enables the deposition of the dielectric film 210 anywhere the material is needed. Additionally, such selective deposition of the dielectric film 210 enables customizing deposition of the dielectric film for uses such as bridging or covering the gap from the functional block 202 to the substrate surface 208, and/or to protect sensitive areas on the functional block 202. Such selective deposition of the dielectric film 210 minimizes the use of the dielectric material where it is not needed. Other methods that can be used for selectively or discretely form the dielectric film 210 include patterning, etching, and photolithography.

One advantage of a structure that incorporates a via or vias and a dielectric layer is that the dielectric layer is necessarily disposed between the functional block, which can be an integrated circuit (IC) for a device, and the conductive interconnect or conductive traces, which could be used to connect the functional block to an external electronic element such as an antenna. The via through the dielectric material provides a direct electrical connection to the IC, but there is still a capacitive coupling between other parts of the functional blocks and the external electronic element. It is disadvantageous to have such capacitive coupling between the IC and the conductive traces, and this capacitive coupling is increased due to proximity of the conductive traces to the IC. Placing the dielectric layer between the functional block and the external electronic element provides some vertical distance between them. Minimizing the size of the interconnection pad, and increasing the vertical distance between the traces and IC, minimizes this capacitive coupling. Additionally, the use of low dielectric constant materials as the dielectric layer will also minimize this capacitive coupling. Examples of low-dielectric constant materials include porous materials, fluorinated materials, and silicon-rich materials.

In one embodiment, each conductive interconnect 214 formed on top of and into (in a via created in the dielectric layer 208) the dielectric layer 208 fills a particular vias 212 so as to establish electrical interconnection to the functional block 202. In the present embodiment, each conductive interconnect 214 constitutes both a via conductor 214-V as well as a pad conductor 214-P. When each of the conductive interconnects 214 fills via 212, the conductive material covers all of the exposed area of the contact pad 216 that is exposed by the via 212. The conductive interconnect 214 can interconnect the functional block 202 to an external electrical element or elements (e.g., antennas or electrodes). The conductive interconnect 214 can also be an electrical or conductive lead from the external electrical element.

The conductive interconnect 214 can formed according to previously referenced applications, e.g., using a roll-to-roll process and/or local printing techniques. In one embodiment the conductive interconnect 214 can be made of a conductive composite of conductive particles in a non-conductive matrix, such as silver ink; metal or metals that are evaporated onto the substrate 206 or onto the dielectric layer 210, over the corresponding via 212, and subsequently patterned; an organic conductor, or composites of carbon nanotubes or inorganic nanowires dispersed in a binder; a conductive composite, such as silver ink or silver-filled epoxy that completely filled by the corresponding vias 212; conductive particles dispersed in a nonconductive or an organometallic matrix (e.g., silver ink), sputtered or evaporated metal, conductive carbon composite, carbon nanotubes, inorganic nanowires dispersed in a nonconductive matrix, and any of these materials combined with metallic nanoparticles; or a nonconductive matrix that consists of a thermoplastic polymer, a thermoset polymer, or a B-staged thermoset polymer. The elastic modulus of a conductive composite that is used to form the conductive interconnect 214 can be between 120,000 psi and 60,000 psi. The resistivity of the conductive interconnect 214 is less than 76 mΩ/square/mil, more optimally, less than 60 mΩ/square/mil, even more optimally less than 42 mΩ/square/mil, and most optimally less than 25 mΩ/square/mil.

Additionally, the conductive interconnect 214 is made of a material that is able to maintain good electrical contact to the top-most conductive feature or features (e.g., the contact pad 216) on the functional block 202, such that the combination of the substrate 206, the functional block 202, the dielectric layer 210, the contact pad 216, and the conductive interconnect 214 is able to maintain sufficient electrical contact throughout, with less than a 10% variation in total resistance. In one embodiment, the combination of the substrate 206, the functional block 202, the dielectric layer 210, the contact pad 216, and the conductive interconnect 214 is able to maintain sufficient electrical contact throughout, with less than a 10% variation in total resistance, when the assembly 200 is subjected to thermal cycles for 100 times from −40° C. to 85° C., and bent over a 1-inch-diameter mandrel for 80-100 times. Each conductive interconnect 214 can partially or completely cover the corresponding via 212 for the conductive material in the via 212 to make electrical contact to the functional block 202 or the corresponding contact pad 216 on the functional block 202. Additionally, the conductive interconnects 214 also have a good adhesion to the dielectric film 210, such that the interconnects can survive flexing over a 1-inch mandrel as previously mentioned.

In one embodiment, the interconnect 214 constitutes a via conductor 214-V and a pad conductor 214-P connecting to a particular contact pad 216. The via conductor 214-V contacts the conductive pad 216 on the functional block 202 at the bottom of the via 212. It is preferable that the via conductor 214-V covers all of the contact pad 216 that is exposed by the via 212.

In one embodiment, the top diameter or the top area of the via conductor 214-V is larger than the top diameter of the corresponding via 212. In one embodiment, the top diameter or the top area of the via conductor 214-V is about 1-3 times larger than the top diameter of the via 212. In another embodiment, top diameter or the top area of the via conductor 214-V is 1-2 times larger than the top diameter of the via 212.

The pad conductor 214-P, in one embodiment, provides a large or larger conductive area for fast electrical coupling of the assembly 200 to a conductor on another electrical functional element, such as a RFID antenna, a display driver strip, or a sensor assembly. In one embodiment, the electrical coupling is achieved through capacitive coupling or through inductive coupling or both. In one embodiment, a resonator loop is added and connected to the pad conductors 214-P to enhance the capacitive coupling. In one embodiment, the pad conductor 214-P is at least (1 mm)×(1 mm) large. Since this interconnection area is larger than the connection or contact pad 216 on the functional block 202, lower-cost, lower-precision equipment can be used to produce electrical contact between the assembly 200 and other functional elements such as antennas. The pad conductor 214-P may be made of the same material or different material as the via conductor 214-V.

Figure 2E:
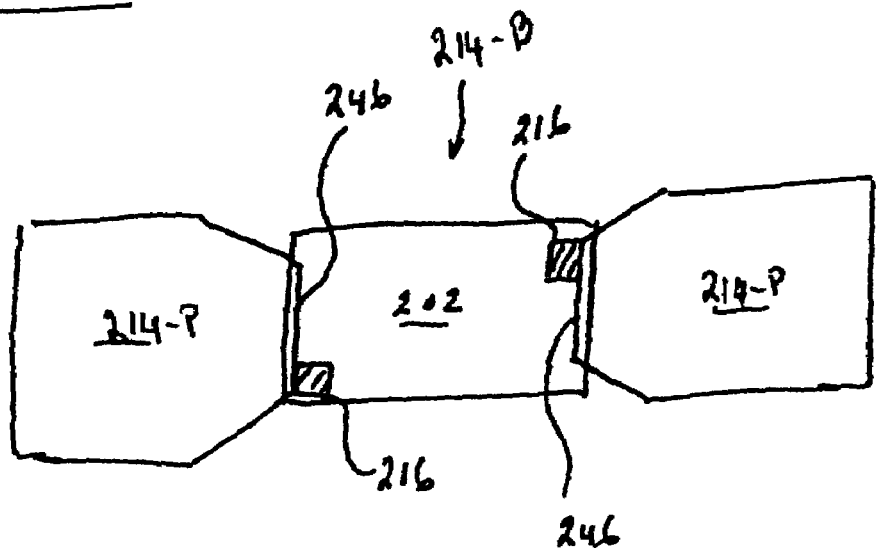
Figure 2E:
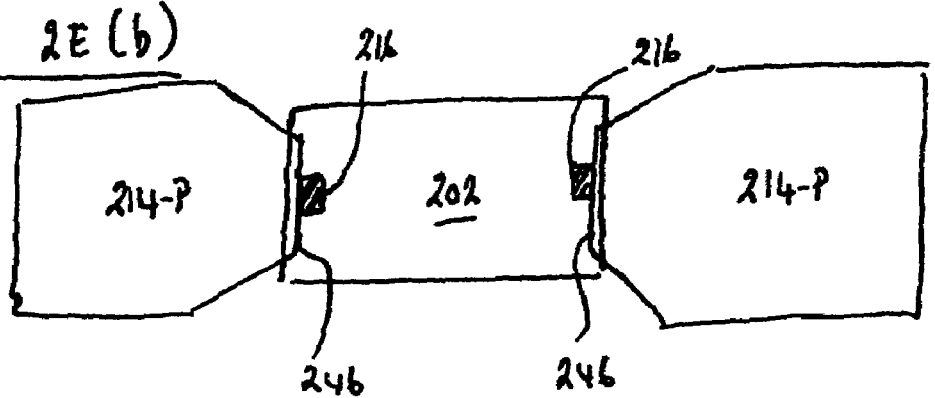
Figure 2F:
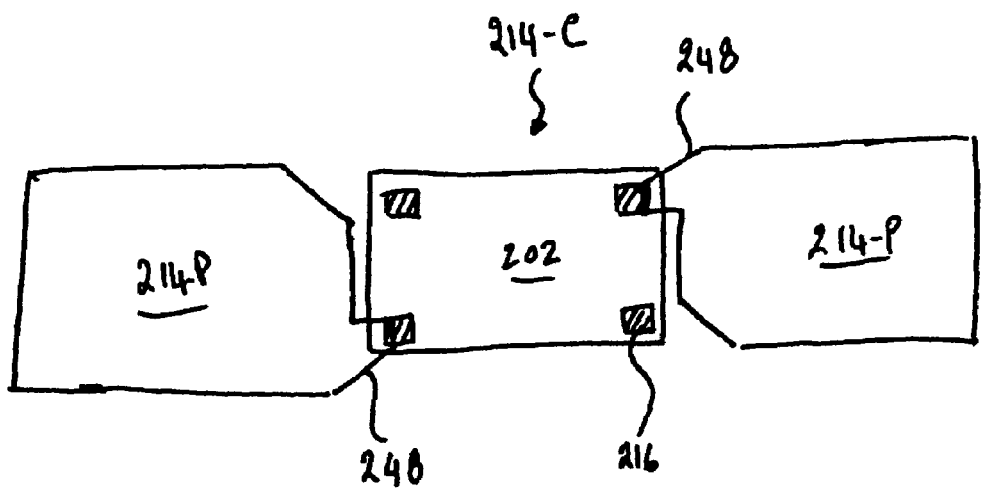
FIG. 2A illustrates an exemplary embodiment of an electronic assembly with a functional block deposited in a substrate.
FIGS. 2B-2C illustrate exemplary embodiments of a via formed in a dielectric layer that is formed over a functional block.
FIG. 2G illustrates an exemplary embodiment of incorporating the assembly formed in FIG. 2A to a second substrate (a device substrate)

The conductive interconnect 214 may have several layouts. Exemplary layouts are shown in FIGS. 2D-2F, below. The layouts in FIGS. 2D-2F illustrate exemplary configurations for the pad conductor 214-P of the conductive interconnects 214. It is to be noted that other configurations are also feasible.

Typically, the assembly 200 includes more than one interconnections 214 and more than one pad conductor 214-P. For instance, the functional block 202 has two contact pads 216 so that multiple connections are needed. In FIG. 2D, a "bow-tie" configuration 214-A is provided. In this configuration, two pad conductors 214-P form a bow tie-like configuration. The configuration 214-A includes two pad conductors 214-P, each of which having two fingers 244 coming out of each pad conductor. The fingers 244 are able to make contact with each of the contact pad 216 at any of the 4 corners of the functional block 202. Each finger 244 would make contact to a contact pad 216 that is closest to the corresponding finger 244. It is preferred to have a limited amount of conductive interconnect 214 over the functional block 202 such that the amount of stray capacitance is limited. Thus, only a small section of each finger 244 overlaps the functional block 202 or a contact pad 216 provided on the block 202. In one embodiment, the finger 244 is less than or equal to the top diameter of the corresponding contact pad 216 that the finger 244 connects to. In one embodiment, the finger 244 covers a portion of the via conductor that connects to the contact pad 216. In one embodiment, the finger 244 covers all of the via conductor that connects to the contact pad 216. The bow-tie configuration 214-A enables the conductive interconnect 214 to make contact to the functional block 202 where the contact pads 216 is placed on any of the four corners of the functional block 202. It may be that the functional block 202 has one contact pad 216. Thus, not all of the fingers 244 would contact a contact pad 216. The functional block 202 thus can also be deposited into a receptor 204 in a manner where the contact pads 216 can be oriented at any corner and still able to allow contact from the fingers 244 to the contacts pads 216.

In FIG. 2E (a)-FIG. 2E (b), another "bow-tie" configuration 214-B, which does not have the fingers 244 shown in the bow-tie configuration 214-A is provided. Instead, in the bow-tie configuration 214-B, sides 246 are provided on the pad conductors 214-P where each of the sides 246 runs across almost the length of each side of the functional block 202. In this configuration, two pad conductors 214-P also form a bow tie-like configuration over parts of the functional block 202. In the present embodiment, each of the sides 246 is placed in contact with a contact pad 216 on the functional block 202. The contact pad 216 can be a corner location as shown in FIG. 2E(a) or at a center location as shown in FIG. 2E(b).

FIG. 2F illustrates an exemplary embodiment of a configuration of the conductive interconnect 214 or the pad conductor 214-P with a non-bow-tie configuration 21C. In the present embodiment, the functional block 202 may have contact pads 216 placed diagonally to each other. The configuration 214-C is similar to the configurations 214-A and 214-B above except that only one arm is necessary on each pad. The configuration 214-C is configured with two pad conductors 214-P each having an arm or extension 248 to make connection to one of the contact pads 216. The arm 238 allows the conductive interconnect 214 to contact the functional block 202 with minimal conductive material over the functional block 202. Other configurations or shape for the extension 248 are possible. The configuration 214-C is especially useful when the functional block does not have rotational symmetry that is greater than 2-fold.

In FIGS. 2D-2F, the contact pads 216 are shown to contact the fingers 244 or the sides 246 of the pad conductor. As previously mentioned, the dielectric layer 210 may be formed over the block 202 and the vias 212 are created in the dielectric layer 210 so that the contact pads 216 are exposed. The vias are filled with conductive interconnects 214 or via conductors 214-V as previously mentioned. As previously mentioned, the vias could also be filled by the same material and at the same time as the sides 246 are form. The fingers or sides from the pad conductors 214-P cover at least a portion of the corresponding via conductors 214-V to establish interconnection to the contact pads 216. For the sake of illustrating the pad conductor layouts, the vias 212 and the via conductors 214-V are not shown in FIGS. 2D-2F.

In one embodiment, each pad conductor 214-P has a resistivity that is less than 25 m$\Omega$/square/mil, optimally less than 18 m$\Omega$/square/mil, and most optimally less than 12 m$\Omega$/square/mil.

In one embodiment, each part of the pad conductor part 214-P that is over the via conductor should be no wider than 2 times the smallest diameter of the corresponding via conductor 214-V, optimally no wider than 1.5 times the diameter of the via conductor 214-V, and more optimally, the same width as the widest diameter of the via conductor 214-V.

Figure 2G:
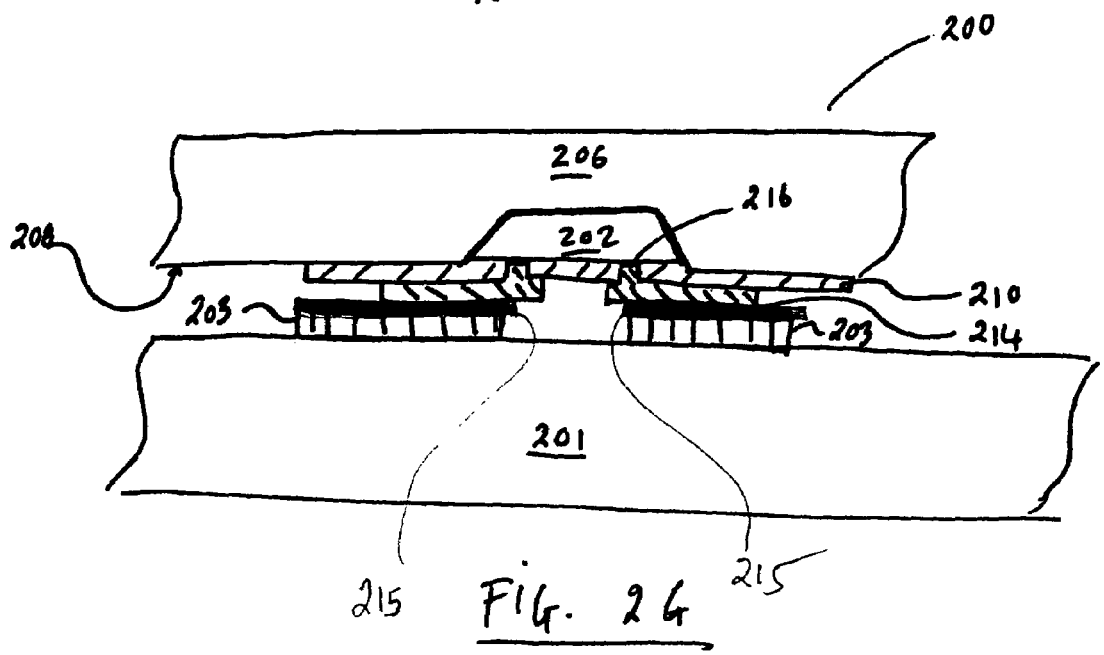

FIG. 2G illustrates a cross-sectional view of the strap assembly 200 being attached to a second substrate or a device substrate 201. The substrate 201 may include other active elements and/or electrical components and in one embodiment, includes a conductor pattern 203 formed thereon. In one embodiment, the conductor pattern 203 is part of an antenna element that can be used for an RFID device. In one embodiment, the strap assembly 200 is coupled to the device or an item through a capacitive coupling between the pad conductors and a conductive element (e.g., antenna) provided on the device. In one embodiment, the substrate 206 is "flipped" over such that the surface 208 is facing the second substrate 201 and the conductor pattern 203. The substrate 206 is attached to the second substrate 201 in a way that the conductor pattern 203 is coupled to the interconnects 214. A non-conductive adhesive layer may be used to facilitate the attachment of the strap assembly 200 to the substrate 206. The non-conductive adhesive layer also functions as a dielectric layer so that the conductor pattern 203 can be capacitively coupled to the interconnects 214. Other sealing materials can also be added.

In one embodiment, the substrate 206 is a monolayer plastic film such as the substrate 206 shown in FIG. 2A. A plastic monolayer base film can be a thermoset or an amorphous or semicrystalline thermoplastic plastic film. In one embodiment, the substrate 206 is a thermoplastic base film and has a glass transition temperature (Tg) of at least about 100° C., more optimally at least about 125° C., and even more optimally at least about 145° C.-150° C. The thermoset plastic film can be selected from UV-curable, moisture-curable, and heat-curable thermoset plastic films. Example of suitable materials that can be used for the substrate 206 include, but are not limited to, polyethylene, polystyrene, polypropylene, polynorbornene, polycarbonate, liquid crystal polymer, polysulfone, polyetherimide, polyamide, polyethylene terephthalate, and polyethylene naphthalate, and derivatives thereof.

Figure 3:
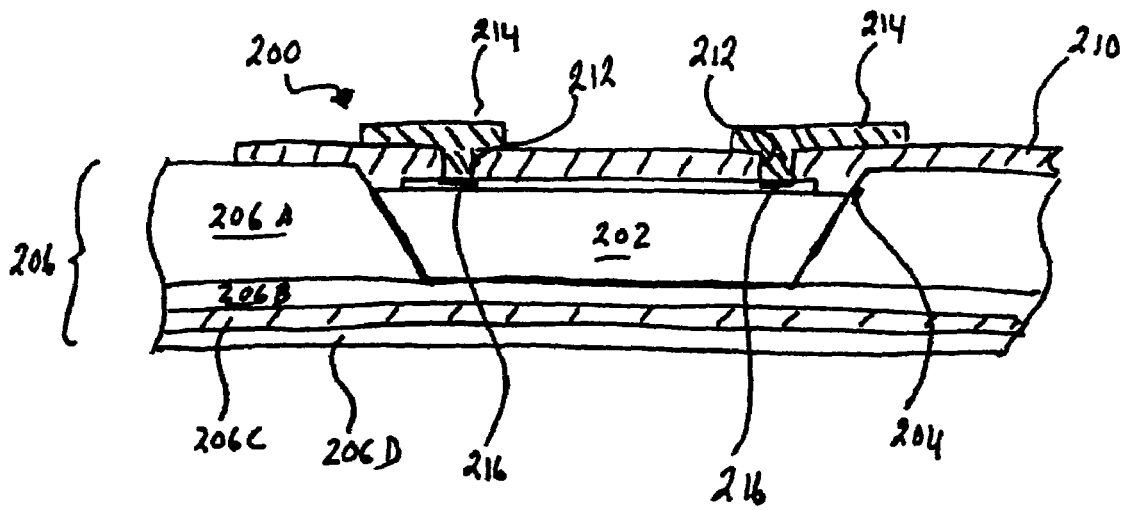
FIG. 3 illustrates an exemplary embodiment of an electronic assembly with a functional block deposited in a substrate that is a multi-layered substrate.

In alternative embodiments, the substrate 206 comprises multiple layers for example, layers 206A-206D, with the recessed regions 204 formed in one of the layers, e.g., the top layer 206A and with the additional layers used to provide one or more of dimensional stability, mechanical strength, dielectric properties, desired thickness, functionalities, etc (FIG. 3).

The substrate 206 is made of a material that minimizes positional distortion of the recessed region 204 after the substrate 206 is subjected to a first thermal excursion for about 30 minutes at about 125° C. Prior to assembling the functional block 202 into the recessed region 204, the substrate 206 is subjected to at least one thermal excursion cycle for about 30 minutes at about 125° C. During this thermal excursion cycle, the recessed region 204 that is formed into the substrate 206 may be distorted positionally. The position of the recessed region 204 on the substrate 206 may move or be distorted slightly due to the heat or change of material characterization due to heat. In one embodiment, the substrate 206 must be made of a material that will cause only about 30-500 µm, more optimally, 30-300 µm, positional distortion to the location of the recessed region 204 that is formed on the substrate 206. Positional distortion refers to the location of the recessed region 204 being moved positionally from the originally created position on the substrate 206. In one embodiment, the substrate has a length of about 200 mm, along which the distortion is measured. Thus, the substrate 206 is made of a material that when subjected to a first thermal excursion causes the recessed region to be move by only about 30-500 µm, or 30-300 µm. In another embodiment, the substrate could have a length that is 300 mm or 500 mm long, and the allowable distortion along such a length would scale linearly with the distortion allowed along a shorter length.

In one embodiment, when the substrate 206 is subjected to a process that forms the recessed region 204, areas around the area where the recessed region 204 is to be formed is maintained at a temperature between about 50° C. and the glass transition temperature of the substrate material. Such temperature control minimizes distortion to the substrate 206 as the recessed region 204 is being formed.

The recessed region 204 is at least as large as the functional block 202 that fills the recessed region 204. More optimally, the recessed region 204 is slightly larger (e.g., 0-10 µm or 1-10 µm) than the functional block 202 in width, depth, and length, and has a sloping sidewall similar to that of the shaped functional block 202. In general, the recessed region matches the shape of the functional block; if the functional block 202 is square, the recessed region 204 is also square, and if the functional block 202 is rectangular, the recessed region 204 is also rectangular.

Figure 4:
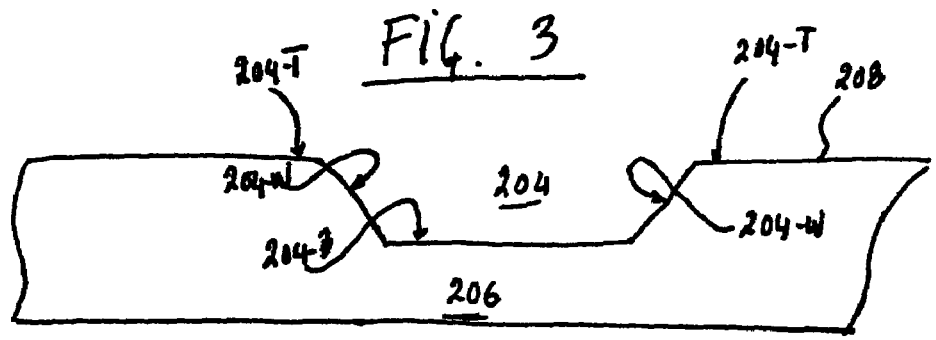
FIGS. 4-5 illustrate aspects of a recessed region formed in a substrate.
Figure 5:
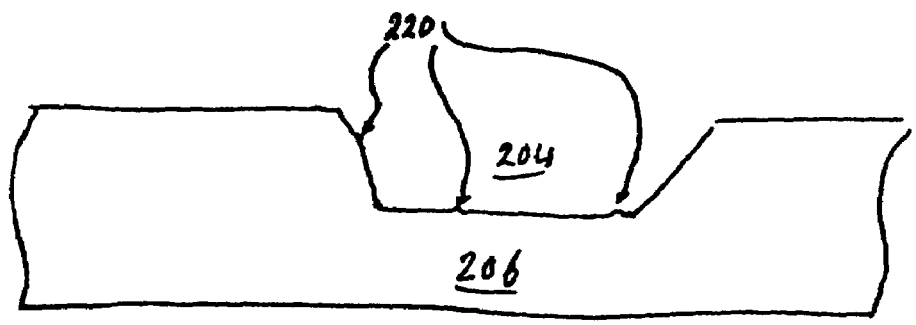

In one embodiment, the substrate 206 is substantially flat, especially in or near the recessed region 204. Substantially flat is characterized by surfaces of the substrate having no protrusion or no protrusion greater than 5 µm. In other words, if there are any protrusions at all, the protrusion is not greater than 5 µm, thus giving the substrate 206 a substantially flat characteristic. FIG. 4 illustrates an exemplary embodiment of the substrate 206 with a top surface 208 that is substantially flat. The substrate 206 only needs to have its top surface 208 (or alternatively, the top surface of the top layer of the substrate 206 when the substrate includes multiple layers) being substantially flat. As shown in FIG. 4, the sides of the recessed region 204 are substantially flat, as well. Thus, top sides 204-T, bottom side 204-B, and sidewalls 204-W of the recessed region 204 are substantially flat with no protrusion. FIG. 5 illustrates an exemplary embodiment of the substrate 206 with some minor protrusions 220 along a surface of the substrate 206. Nevertheless, the protrusions 220 are so minor that the substrate 206 still has the substantially flat characteristic and that the recessed region 204 has sides that are substantially flat.

The recessed region 204 has a width-depth aspect ratio that is configured to substantially match a width-depth aspect ratio of the functional block 202. In one embodiment, the recessed region 204 has a width-depth aspect ratio that is less than 14:1, optimally, less than 10.5:1, and even more optimally, less than 7.5:1. The functional block 202 thus has a similar width-depth aspect ratio.

The substrate 206 is also selected so that the substrate has a good thermal stability to withstand standard processing. The material of the substrate 206 is such that the substrate 206 allows the recessed region 204 to maintain the same positional accuracy requirements previously mentioned. The substrate 206 is made of a material that is able to allow the recessed region 204 to maintain its positional accuracy after going through a 125° C.-150° C. thermal excursion.

In many embodiments, the assembly 200 is cut, sliced, separated, or singulated from a plurality of web-assembled assemblies as will be described below. Thus, a plurality of assemblies 200 can be formed in one short time frame. A roll-to-roll process can be used. A web substrate is provided. The web substrate may be a continuous sheet of web material which when coiled, is a roll form. A plurality of recessed regions 204 is formed into the web material to form the web substrate. A plurality of functional blocks 202 are deposited into the recessed regions 204 on the web substrate (e.g., using an FSA process) to form a plurality of the assemblies 200 shown in FIG. 2A. Areas or strips of the web substrate can later be sliced, singulated, cut, or otherwise separated to produce individual assemblies 200. In one embodiment, a web sheet having a plurality of assemblies 200 is attached to another web substrate similarly to previously described in FIG. 2G. Indexing and/or registration may be required to assemble the strap assemblies 200 to the respective devices since the strap assemblies 200 can be formed as much smaller devices and in higher density per area of a substrate or web material than the final devices they are incorporated in. Thus, singulating the individual strap assemblies and then matching them or aligning them over the respective final device is often required. Individual devices can then be formed by slicing or singulating after the substrates are adhered to one another as illustrated in FIG. 2G.

Figure 6A:
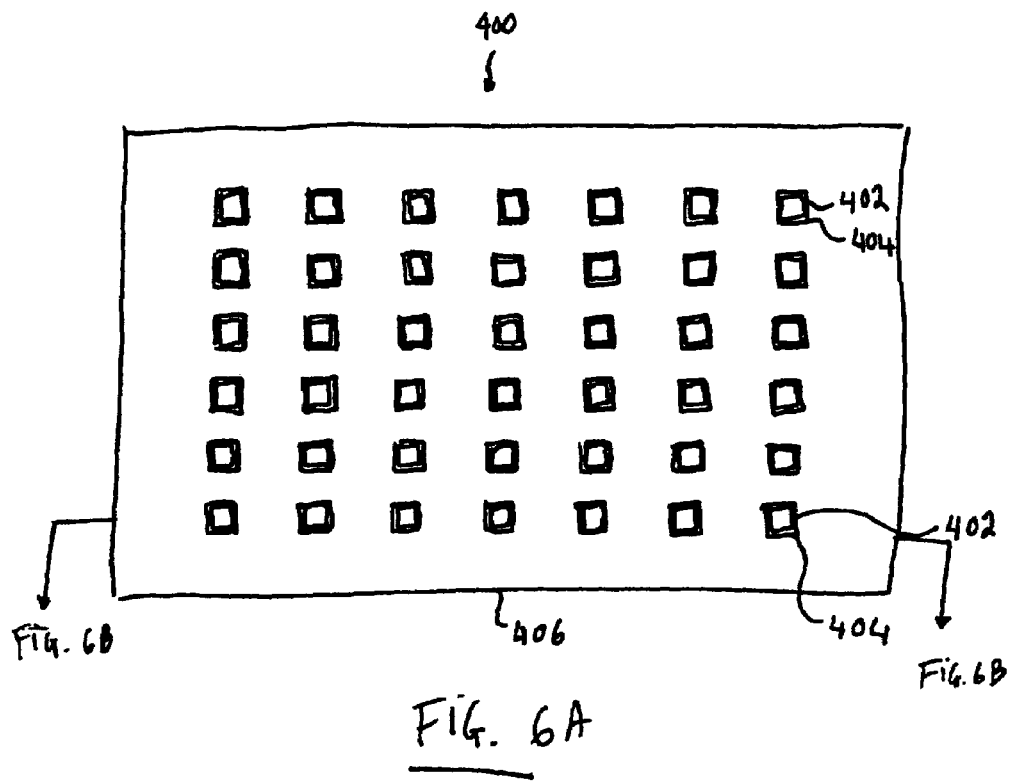
FIG. 6A illustrates an exemplary embodiment of an electronic assembly with multiple functional blocks deposited in a substrate with a plurality of recessed regions.
Figure 6B:
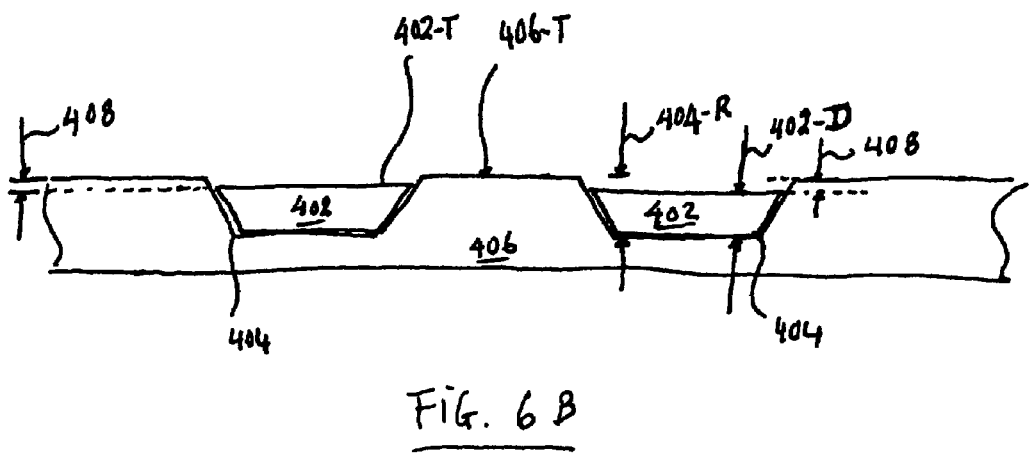
FIG. 6B illustrates an exemplary embodiment of an electronic assembly with multiple functional blocks deposited in a substrate with the functional blocks being recessed below a surface of the substrate.

FIGS. 6A-6B illustrate an assembly 400 that includes several assemblies formed similarly to the assembly 200. The assembly 400 is similar to the assembly 200 above except when multiple assemblies are formed on one piece of substrate material. In FIGS. 6A-6B, a substrate 406 includes a plurality or a population of recessed regions 404 formed therein. Each recessed region 404 includes a functional block 402 deposited therein. The assembly 400 is also similar to the assembly 200 shown above except that there are more of the functional blocks deposited in the substrate. Singulating areas of the substrate 406 after the functional blocks 402 have been deposited and other elements formed thereon can produce a plurality of assemblies 200 shown above. The substrate 406 can be a web substrate, a frame of a web substrate, a section of a web substrate, or a sheet substrate. In some embodiments, all of the available recessed regions 404 in the substrate 406 are filled with functional blocks 402. In some embodiments, 90-100% of the available recessed regions 404 in the substrate 406 are filled with functional blocks 402. In yet other embodiments, 50-100% of the available recessed regions 404 are filled.

The recessed region 404 has a width-depth aspect ratio that is configured to substantially match a width-depth aspect ratio of the functional block 402. In one embodiment, the population of the recessed regions 404 has an average width-depth aspect ratio that substantially matches the average width-depth aspect ratio of the functional blocks 402 or in some case, the width-depth aspect ratio of each of the functional blocks 402. The average width-depth aspect ratio of the population of the recessed region is less than 14:1, optimally, less than 10.5:1, and even more optimally, less than 7.5:1. The functional blocks 402 thus have a similar width-depth aspect ratio to the recessed regions' width-depth aspect ratio.

In terms of recessed regions' depth, it is important to take into account the entire population of the depths 404-R of the recessed regions 404 and the thicknesses 402-D of the functional blocks 402. The thickness 402-D of each of the functional blocks 402 should account for any contact pads on top of the functional block 402. In one embodiment, after all the functional blocks 402 are deposited into their corresponding recessed regions 402, a substantial amount of the plurality of functional blocks 402 are recessed below a top surface 406-T of the substrate 406. In one embodiment, there is a gap 408 between the top surface 402-T of the functional block 402 and the top surface 406-T of the substrate 406. In one embodiment, the gap 408 is between about 0-10 µm. In one embodiment, the substantial amount of the functional blocks 402 being recessed below the surface of the substrate 406 is defined by (1) less than 10% of the population of the functional blocks protrude above the top surface 406-T of the substrate 406; (2) less than 1% of the population of the functional blocks 402 protrude above the top surface 406-T of the substrate 406; (3) more than 90% of the functional blocks 402 are recessed below the top surface 406-T of the substrate 406; or (4) more than 99% of the population of the functional blocks 402 are recessed below the top surface 406-T of the substrate 406.

The populations of the depths 404-R of the recessed regions 404 and the thicknesses 402-D of the functional block thickness can be represented by distribution with an average depth or thickness ($\mu_r$ or $\mu_N$, respectively) and a standard deviation ($\sigma_r$ or $\sigma_N$, respectively). The probability that a functional block 402 protrudes up from a recessed region 404 can be determined by comparing the difference (A) in averages to the combined standard deviation, $\sigma_c$, where $$\Delta = \mu_r - \mu_N \text{ and } \sigma_c = \sqrt{\sigma_r^2 + \sigma_N^2}.$$

It is desirable to have $\sigma_c < \Delta$. More preferably, using the equations above and applying Normal statistics, it is preferable to have ac and A such that less than 10%, or more preferably less than 1%, of the population of the functional blocks 402 protrude above the top surface 406-T of the recessed regions 404.

In one embodiment, the assembly 400 is characterized in that the locations of the recessed regions 405 on the substrate 406 have a good positional accuracy. In one embodiment, across a 158 mm-wide area of the substrate 406, the positional accuracy of each recessed region 404 is within 100 µm at 3σ, in another embodiment, within 50 µm at 3σ, and in another embodiment, within 30 µm at 3σ. These positional accuracy numbers also scale linearly with the width of the substrate 406. For example, when the substrate 406 has a width of about 316 mm the positional accuracy of the recessed regions 404 is within 200 µm at 3σ. Similar to the assembly 200, the assembly 400 includes a dielectric film formed over the functional blocks 402, vias formed in the dielectric film to expose contact pads on the functional blocks 402, and conductive interconnections to establish electrical connections to the functional blocks 402.

The substrate 206 or 406 with recessed regions previously described can be processed using various exemplary methods and apparatuses of the present invention to form the recessed regions.

The recessed regions can be formed into the substrate using methods known in the art of methods disclosed in previously referenced applications, e.g., using a roller or a template with protruding features that when pressed into the substrate, creates holes or recessed regions in the substrate.

The substrate may be comprised of polyether sulfone (PES), polysulfone, polyether imide, polyethylene terephthalate, polycarbonate, polybutylene terephthalate, polyphenylene sulfide (PPS), polypropylene, polyester, aramid, polyamide-imide (PAI), polyimide, nylon material (e.g. polyiamide), aromatic polyimides, polyetherimide, polyvinyl chloride, acrylonitrile butadiene styrene (ABS), or metallic materials. Additionally, the substrate when in a web process can be a flexible sheet with very high aspect ratios such as 25:1 or more (length:width). As is known, a web material involves a roll process. For example, a roll of paper towels when unrolled is said to be in web form and it is fabricated in a process referred to as a web process. When a web is coiled, it is in roll form.

Figure 7:
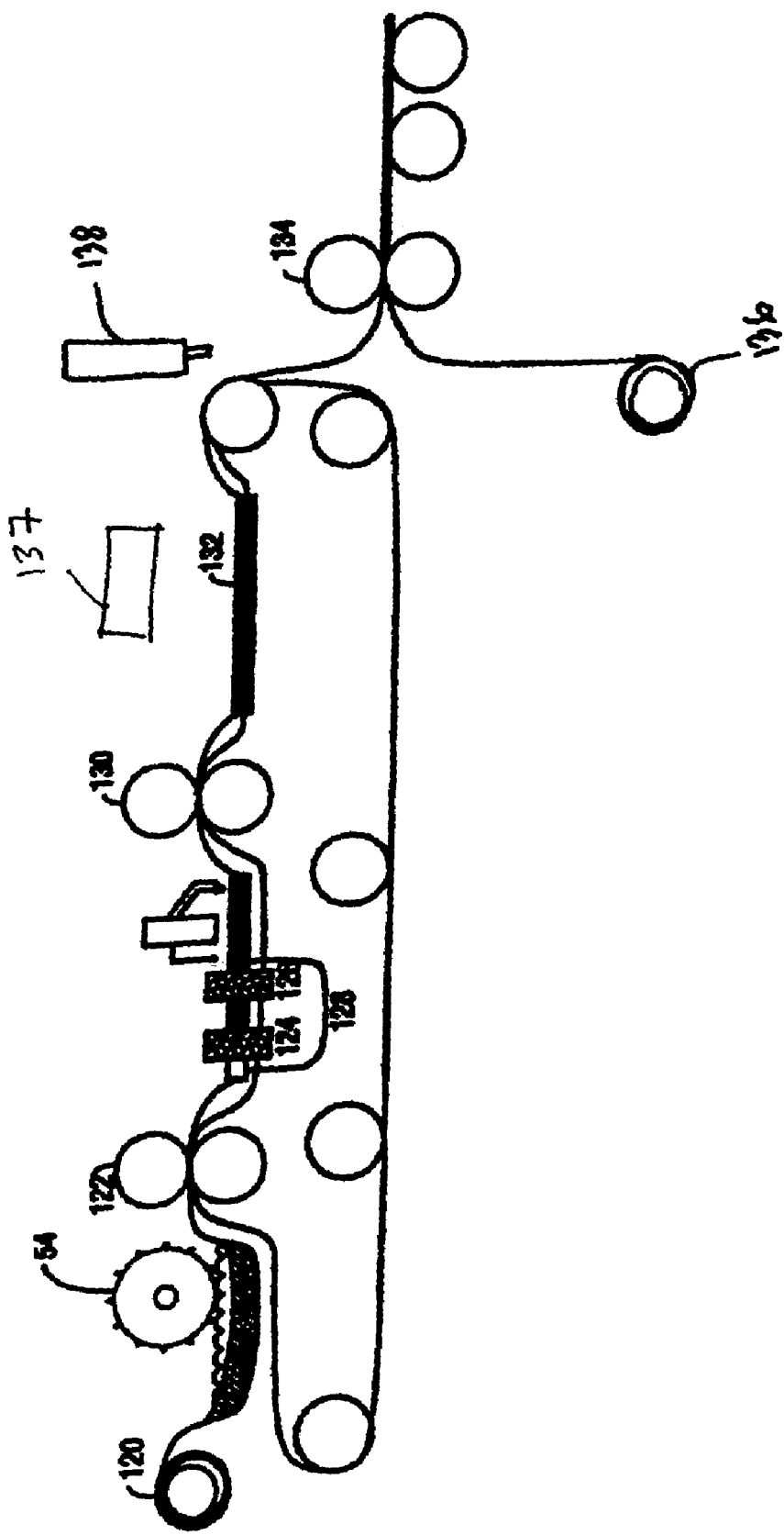
FIG. 7 illustrates an exemplary embodiment of an overall process of making an electronic assembly with functional block in accordance to embodiments of the present invention.

FIG. 7 shows an overall process of fabricating an electronic assembly in according to embodiments of the present invention. Although the discussion below illustrates processes that may be continuous, other separate or sub-processes can also be used. For instance, a process that is continuous as shown in FIG. 7 can be separated into separate or sub-processes. The process in FIG. 7 can take place on one machine or on several machines. The process line in FIG. 7 can also be controlled by a programmable machine equipped with a processor or a control unit as is known in the art.

FIG. 7 illustrates a web process where a web substrate is used for forming a plurality of electronic assemblies such as the assembly 200 or 400 previously described. A roll of substrate 120 is provided. The substrate 120 is flexible. The substrate 120 may be sprocket-hole-punched to assist in web handling. The substrate 120 is advanced from a station 117 or a roller 117 to a station 119 that forms a plurality of recessed regions as previously described. The recessed regions can be formed by machining, etching, casting, embossing, extruding, stamping, or molding. In one embodiment, a roller with protruding structures is provided for the formation of the recessed regions. The substrate 120 is advanced through a set of support members 122 as the recessed regions are created into the substrate 120. A fluid self-assembly process can be used to deposit a plurality of functional blocks into the recessed regions formed in the substrate. In one embodiment, a first slurry 124 containing a plurality of functional blocks is dispensed onto the substrate 120. A second slurry 126 containing a plurality of functional blocks may also be used to dispense onto the substrate 120. Excess slurry is collected in container 128 and is recycled. The functional blocks fall into the recessed regions in the substrate. The substrate 120 is then advanced to another set of support members 130. An inspection station (not shown) may be provided to check for empty recessed regions or for improperly filled recessed regions. There may also be a clearing device (not shown) to remove excess functional blocks or blocks not completely seated or deposited into the recessed regions of the substrate 120. A vibration device (not shown) may be coupled to the substrate 120 and/or to the slurry dispensing device to facilitate the distribution and/or of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated by reference in its entirety. In one embodiment, the functional blocks are deposited onto the substrate material using methods described in U.S. patent application Ser. No. 10/086,491. In one embodiment, the functional blocks are deposited onto the substrate using fluidic self-assembly process on a continuously moving web (the substrate 120).

The functional blocks can have shapes such as square, rectangular, trapezoid, cylinder, asymmetric block, asymmetric rectangular, and asymmetric trapezoid. The recessed regions have similar shapes as the functional blocks.

Continuing with FIG. 7, and generally shown at 132, a planarization (or dielectric) layer is then deposited or laminated or otherwise formed onto the substrate material. Vias are formed in the dielectric film. The dielectric layer can be applied using a variety of methods as previously disclosed such as direct writing, laser-assisted deposition, screen printing, or wet coating (e.g., by comma coating or other types of roll-to-roll liquid coaters).

In one embodiment, the deposition of the functional blocks by FSA and the formation of the dielectric film are done on the same machine. Thus, after the functional blocks are deposited, the web substrate 120 is advanced to a station where the dielectric layer is formed.

In one embodiment, vias are formed into the dielectric layer to allow for interconnections to and from the functional blocks. To form the vias that can expose the contact pads on the functional blocks, the substrate with the functional blocks deposited therein is inspected by an optical scanner (not shown) prior to via formation to determine the location of the contact pads on the functional blocks that need vias over them. Preferably, this inspection is done in-line with the via formation process, and the image analysis is done automatically by a computerized vision system (not shown), and the results are sent directly to the via formation apparatus to select which vias to form. As a result, vias are only formed in the dielectric above the contact pads of the functional blocks.

The via opening(s) in the dielectric layer can be opened either before or after the dielectric film is placed on the functional blocks-filled substrate. The openings could be punched prior to dielectric layer application to the filled substrate web, or could be created by etching, photolithography, or by laser via drilling after the dielectric film is deposited over the substrate. Laser drilling can be used to form the vias, which could be accomplished with either a UV, visible, or IR laser. To avoid some potential problems or damages with some conventional drilling techniques to form vias, a laser drilling is used. For instance, damages may happen in a conventional drilling method when drilling is done to remove the dielectric material over the output pads on the functional blocks and when drilling is done on the locations on the blocks where there is no output pads causing damages to the blocks' passivation layer. In one embodiment, a protective bump (conductive bump or gold bump) is placed on the output pads of the functional blocks to the protect the output pads from being drilled. Additionally, the substrate is scanned (e.g., using a 720 dpi scanner) for the orientation and location of the functional blocks in the substrate prior to drilling to allow accurate drilling through the dielectric layer.

In one embodiment, the substrate 120 is held flat on a chuck, scanned, and then drilled to form a group of vias prior to indexing forward so that another section of the substrate 120 can be treated. The scanning (e.g., optical scanning) and the via drilling may also occur on a moving web when the substrate 120 is moving or moving continuously.

Conductive interconnects are then formed into and on the dielectric film. In one embodiment, the conductive interconnects are formed in a continuously moving web. The conductive interconnects also fill the vias to allow electrical interconnection to the functional blocks. In one embodiment, the vias are filled with a conductive material to form via conductors. A pad conductor is then formed on the dielectric film to interconnect to each via conductor. Each pad conductor and via conductor can form a conductive interconnect and/or be made of the same materials and in one process in many embodiments. The via conductors and the pad conductors can be formed on a continuously moving web of the substrate roll 120. The planarization and the conductive interconnect formation are generally shown at 132 in FIG. 7. Conductive interconnects can be formed using methods previously disclosed in previously referenced applications, e.g., deposition, patterning, etching, printing, local printing, direct write, screen printing, syringe dispense, laser assisted deposition, etc.

The via conductors and the pad conductors can be made of one or more of the following: conductive particles dispersed in a nonconductive matrix (e.g., silver ink, sputtered/evaporated metal, conductive carbon composites, carbon nanotubes) or inorganic nanowires dispersed in a nonconductive matrix (e.g., a thermoplastic polymer, a thermoset polymer, or a B-staged thermoset polymer), or any of these materials combined with metallic nanoparticles. The via conductors and the pad conductors' materials are prepared so that they can be deposited on a continuously moving web.

Other stations or devices can be provided for forming other elements, e.g., an inductive loop or a resonator loop.

A station 138 may be provided to inspect and/or test the functionality of the assemblies. The assemblies are tested for functionality such that known-bad assemblies can be marked, so that they can be actively avoided in future process steps. Known-good assemblies can be marked, so that they can be actively selected in future process steps. The mark can be an ink mark, ink jet marking, stamping, or a laser burn mark, or any other mark that is detectable by either a human eye, a sensor, or both. In one embodiment, the marking is a laser marking and is applied to the particular pad conductors so as to leave a black mark on the pad conductors. In one embodiment, the tests are done by coupling the electromagnetic energy from the tester to the assemblies. The coupling can be resistive, inductive, or capacitive, or a combination thereof, using contact methods (e.g., direct electrical contact), non-contact methods, or a combination thereof. Even in a densely-packed set of straps, individual assemblies can be tested without undue interference from neighboring devices. In one embodiment, individual assemblies are tested based on a predefined set of criteria or parameters, for instance, one assembly out of every 10 assemblies formed on a web is tested. Other criteria or parameters are of course possible. In one embodiment, a test board such as those described herein (FIGS. 28-30) is provided at the station 138 for certain functional testings.

After the testing, the substrate 120 is further advanced to another set of support members 134 for subsequent processing or lamination processes. In one embodiment, an additional conductive trace is formed on the substrate 120 to interconnect to the conductive interconnect. The conductive trace may be a resonator lop or other conductive element for an external electrical element. The conductive trace may be formed by a convenient method such as printing, laminating, deposition, etc. A roll of material 136 is shown to laminate to the substrate 120. The material from the roll 136 can be a cover a jacket or other suitable material for subsequent processing or for completing the assemblies. In one embodiment, the roll 136 is a device substrate having formed thereon a conductor pattern. In one embodiment, the roll of material 136 comprises resonator assemblies or other conductive assemblies to be interconnected to the strap assemblies as described herein. The substrate 120 having the functional blocks deposited therein and other elements formed therein/ thereon is attached to the substrate from the roll 136 such that the conductive interconnects are coupled to the conductor pattern. Another roll of material similar to roll 136 can also be provided in the same process line and can be comprised of antenna assemblies that can be laminated or otherwise coupled to the strap assemblies. In one embodiment, the substrate assemblies after processed as shown in FIG. 7 are singulated or cut to form individual assemblies.

In one embodiment, a roll of substrate with recessed regions formed therein is formed by joining several sheets of materials having the recessed regions together as illustrated. In many instances, a number of certain predefined sections of the substrate are formed, for example, using a template. These sections of substrate with the recessed regions formed therein are then spliced, welded, or otherwise attached to one another to form a long section or a roll of substrate. After the roll of substrate is formed, a web process line processing similar to those processes described in FIG. 7 to deposit the functional blocks and form other elements on the substrate.

Many embodiments of the present invention pertain to electrically coupling the RFID chip(s) in a strap assembly to an external device such as an antenna through non-direct contact, e.g., through capacitive coupling. Most common (UHF or higher frequency, 500 MHz-5 GHz) RFID chips have an RF equivalent circuit as shown in FIGS. 8-9. In FIG. 8, a first circuit 100 is basically a capacitor (Cp) 102 that is in parallel with a resistor (Rp) 104. The capacitance in the capacitor 102 represents a RF pad of an RFID chip and parasitic capacitance to ground. The resistor 104 represents the RF power dissipation in the RFID chip and is a combination of parasitic loss and real power converted to the direct current (DC) chip power.

For all practical purposes, over a frequency range of about 500 MHz-5 GHz, the range of frequencies around the design frequency, the circuit 100 is approximately equivalent to a series circuit 101 shown in FIG. 9. In FIG. 9, a second circuit 101 is basically a capacitor (Cs) 103 that is in series with a resistor (Rs) 105. The capacitor 103 represents the combined capacitance of the RF pad of the RFID chip, any multiplier elements in the chip, and any parasitic capacitance in the chip. The resistor 105 represents the RF power dissipation in the RFID chip and is a combination of parasitic loss and real power converted to the direct current (DC) chip power. Both circuits 100 and 101 are useful in explaining how and RFID tag antenna works.

For optimum chip performance at a given frequency, an RFID tag needs to have a good impedance conjugate match between an antenna impedance (Zant) and a chip impedance (Zchip). Thus minimal power is reflected and maximum power is coupled into the chip. FIG. 10A illustrates an equivalent circuit model 301 for an RFID antenna coupled to an RFID tag with $V_a$ referring to the voltage source that represents the electric field from the RFID tag. The antenna has a resistance and reactance and can be expressed by the following equation:

$$Zant=Rant+jXant \quad (1)$$

where "Rant" refers to the antenna resistor and "jXant" refers to the antenna reactance.

The RFID chip also has a resistance and reactance and can be expressed by the following equation:

$$Zchip=Rs+jXchip \quad (2)$$

where "Rs" refers to the chip resistor and "jXchip" refers to the chip reactance.

Thus, for a good match we need the chip impedance and antenna impedance to be approximately equal:

$$Zant=Zchip \quad (3)$$

with an imaginary part conjugate match:

$$Xand=-Xchip \quad (4)$$

and, a real part match:

$$Rant=Rs \quad (5)$$

Typically, UHF RFID tags operate in a band of frequency range and as such, it is better to match the RFID chip and antenna over a range of frequencies rather than at one point. RFID tags can also shift in frequency when the RFID tags are placed on particular products. Thus, it is desirable to design the RFID tags to be matched over a wide range of frequencies.

In one embodiment, to match an antenna impedance to chip impedance a loop inductor L 302 is added to the chip of an RFID tag so that the loop resonates with the capacitor to cancel reactance (capacitance of the chip) at a given frequency (usually close to the design frequency of the tag, but not exactly). FIG. 10B illustrates an equivalent circuit 107 of an RFID chip with an added loop inductor (L) 109. The RFID chip with the added loop inductor (L) may be referred to as a "resonator." Also shown in the circuit 107 are the chip capacitor (C) 111 and resistor (R) 113. The size of the loop inductor 109 is selected such that the inductance of the loop cancels the capacitance. For example, an RFID chip with a large capacitance usually needs to be coupled to a shorter loop inductor than an RFID chip with a smaller capacitance. The addition of the loop inductor also allows current to be absorbed into the resistor more efficiently thus allowing more energy to be transferred to the RFID chip. Further, the addition of the loop inductor allows for the RFID chip to be electrically connected to the antenna to complete the RFID tag without a direct or physical interconnection (e.g., capacitive coupling) as will be further described below. It can also be expressed that the loop inductor size is chosen so that at a particularly frequency, the expressions below are true. Under such conditions, the inductance of the chip cancels the capacitance and can be expressed as followed:

$$\omega^2 LC=1 \quad (6)$$

$$\text{where } \omega=2\pi(\text{freq}) \quad (7)$$

$$\text{and } L=1/\omega^2 C \quad (8)$$

L is the inductor of the chip; C is the capacitor of the chip, ad ω is the angular frequency in radians per second.

Figure 11:
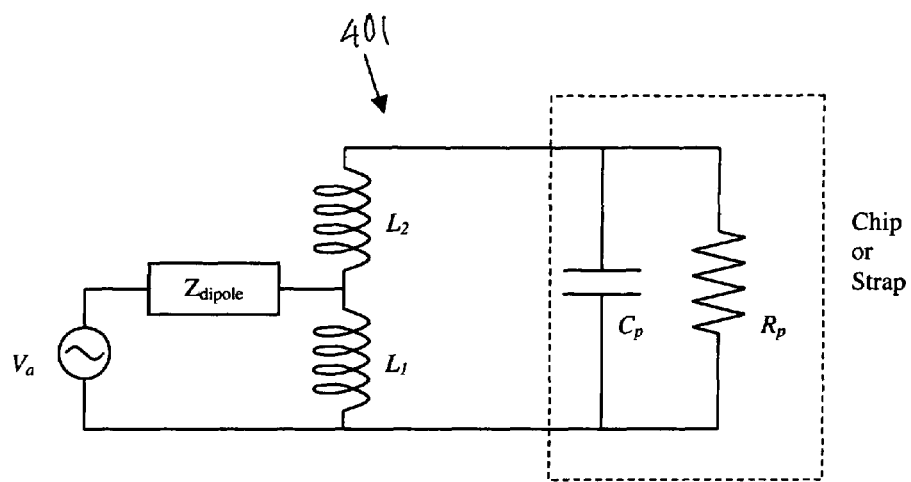
FIG. 11 illustrates an example of an equivalent circuit of an RFID integrated circuit chip coupled to an antenna with a physical contact between the chip components and the antenna.

FIG. 11 illustrates an equivalent circuit 401 of an RFID tag having an RFID chip (or integrated circuit) trap attached to an antenna. The RFID chip (not shown) can be attached to, adhered onto, embedded within, or otherwise secured to a carrier or a substrate. The antenna (not shown) can also be provided on another substrate. In this figure, Va=a voltage source that represents the electric field;

Zdipole=an impedance of a dipole antenna;

L1,L2=inductors representing the loop that couples the strap or chip to the antenna;

Ca=an effective parallel capacitance of the chip or strap; and

Rp=an effective parallel resistance of the chip or strap.

Figure 12:
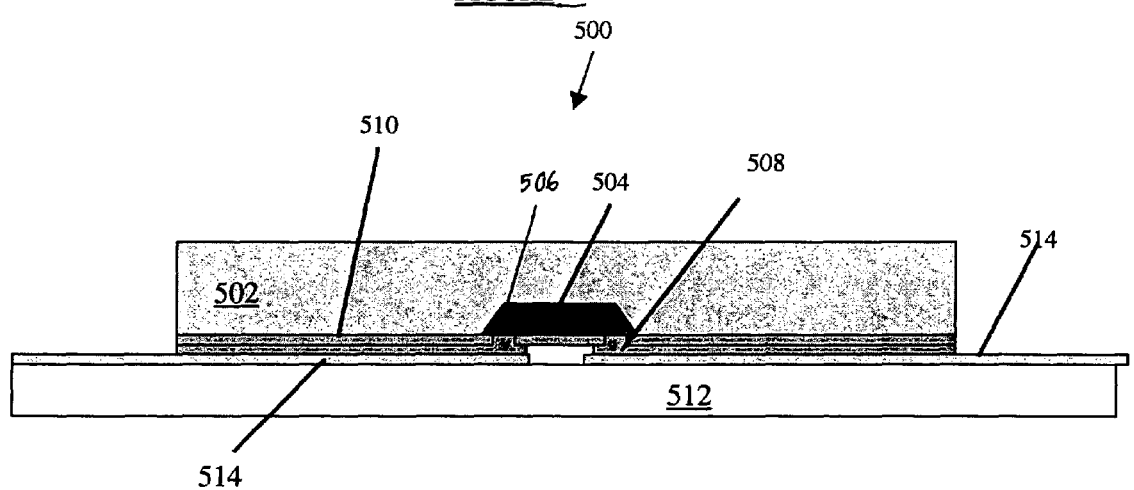
FIG. 12 illustrates an example of a structure with the equivalent circuit of FIG. 11.

FIG. 12 illustrates a structure of an RFID tag 500 that has the equivalent circuit 401 shown in FIG. 11. In this figure, the RFID tag 500 includes an interposer substrate 502 (or a strap substrate) having formed therein or thereon a functional block 504 and interposer pad conductors 508. The functional block 504 includes contact pads 506 which are interconnected to the pad conductors 508. The functional block 504 also includes integrated circuit designed for a particular RFID device as is known in the art. A dielectric layer 510 may be formed on the interposer substrate 502. The pad conductors 508 allow external devices or other conductive components to be electrically connected to the integrated circuit of the functional blocks 504. The interposer substrate 502 with all the necessary components is laminated or coupled to an external electrical device such as an antenna assembly which includes a device substrate 512 and an antenna element 514. The interposer substrate 502 with all the necessary components, e.g., functional block interconnections and dielectrics may be referred herein as a strap or an RFID strap. Methods to form such an RFID tag 500 can be found in U.S. Pat. Nos. 5,782,856; 5,824,186; 5,904,545; 5,545,291; 6,274,508; and 6,281,038, which are all hereby incorporated by reference in their entireties. Methods to form such an RFID tag 500 can also be found in co-pending U.S. application Ser. Nos. 11/159,550; 11/139,526; and 11/159,574, which are all hereby incorporated by reference in their entireties.

As shown in FIG. 12, the functional block 504 and the interposer pad conductors 508 are directly and physically connected to the antenna element 514 for an operative coupling to form the RFID tag 500. Such direct coupling is expensive and complicated in that it requires rigid alignment so that the antenna element (or its leads) can physically and properly contact the interposer pad conductors 508 to cause electrical interconnections. In order to lower the cost of manufacturing as well as to make the assembling of the final product (e.g., the RFID tag) less expensive and less complicated, a non-direct contact coupling is provided. In one embodiment, a capacitive coupling is formed when the final product is assembled.

A direct or physical contact between an integrated circuit and an antenna (or other conductive pattern) refers to a direct and physical electrical coupling where a mechanical contact is present between a conductive element of the antenna and a conductive pad provided on the integrated circuit. It is through the contact of the conductive elements that a direct current is formed for the electrical interconnection.

On the other hand, a non-direct or non-physical electrical contact between the integrated circuit and the antenna (or other conductive pattern) refers to an electrical coupling where no contact is present between the conductive element of the antenna and the conductive pad provided on the integrated circuit. In the embodiments of the present invention, the antenna (or the conductive pattern) is electrically coupled to the integrated circuit via coupling to the resonator by inductance or by capacitance (with no direct contact between conductive elements).

Figure 13:
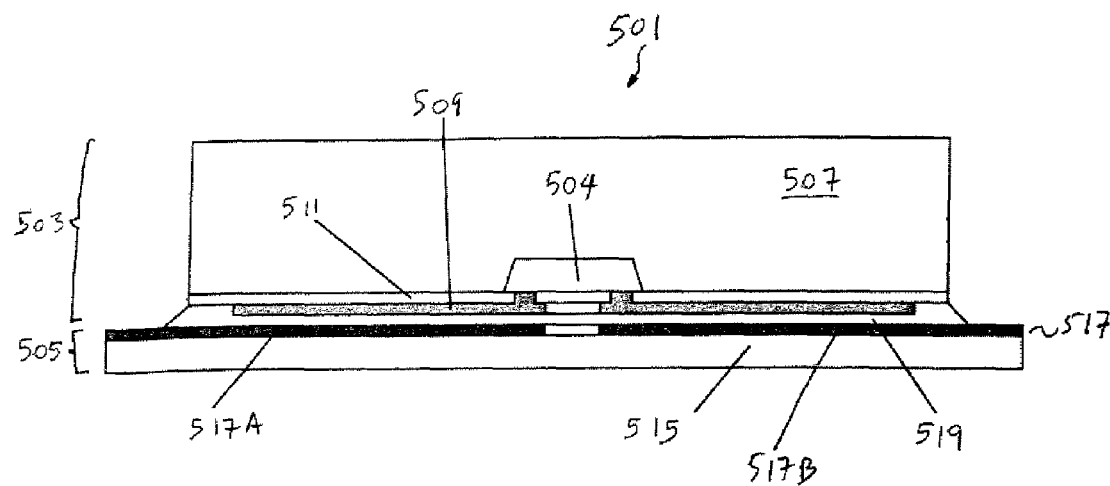
FIG. 13 illustrates an example of an RFID integrated circuit chip coupling to an antenna without a physical or direct contact but with a capacitive.

In FIG. 13, a device is formed with an IC contained in a strap assembly and capacitively coupled to a conductor pattern formed on a different substrate. In FIG. 13, the IC can be an RFID IC and the conductor pattern can be an antenna and as such, an RFID device or tag is formed by capacitive coupling. The strap assembly may be attached to the antenna substrate by a pressure sensitive adhesive (PSA) or other non-conductive adhesive. The adhesive itself may be used as the dielectric material of the capacitive coupling. The adhesive can be a laminated film or an adhesive that cures or melts. The adhesive can also be a drop of low viscosity liquid such as a cyanoacrylate or UV cured adhesive.

In more particular, referring to FIG. 13, a device or an RFID device 501 includes a strap assembly 503 and an antenna assembly 505 coupled to each other. The strap assembly 503 includes a functional block 505 embedded within a receptor site provided within a strap substrate 507. The functional block 505 includes contact pads (not shown) which are connected to interconnections 509 (including via conductors and pad conductors). A dielectric layer 511 is also provided over the strap substrate 507. The functional block 505 is deposited so that it is flush with the surface of the substrate 507.

The antenna assembly 505 includes an antenna pattern 517 (comprising antenna elements 517A and 517B) formed on a surface of a substrate 515. A non-conductive adhesive layer 519 is disposed between the antenna pattern 517 and the interconnections 509 so that the antenna 517 and the interconnections 509 form a capacitive coupling with the adhesive layer 519 being a dielectric layer. The adhesive layer 519 also functions to adhere the strap assembly 503 and the antenna assembly 505 together.

In one embodiment, the adhesive layer 519 is a double-sided adhesive layer attached to the strap assembly 503 (or the antenna assembly 505) with a release liner (not shown) so that the removal of the release liner allows the strap assembly 503 to be adhered to the antenna assembly 505.

Figure 14:
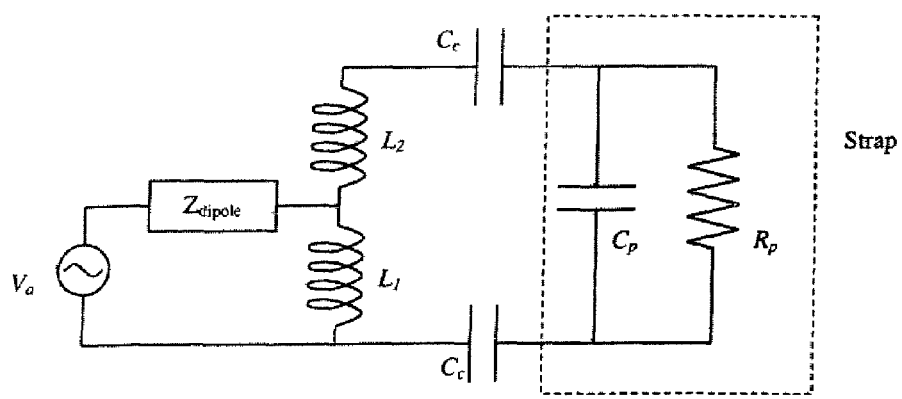
FIG. 14 illustrates an example of an equivalent circuit of an RFID integrated circuit chip coupling to an antenna without a physical or direct contact but with an capacitive coupling shown in FIG. 13.

FIG. 14 illustrates an equivalent circuit 531 of an RFID device with an IC capacitively coupled to an antenna. In this figure, the integrated circuit chip of the RFID tag is capacitively coupled antenna elements and separated from the antenna elements by a dielectric layer so as to form a capacitive coupling between the antenna and the RFID chip. In this figure, Va=a voltage source that represents the electric field form an antenna;

Zdipole=an impedance of a dipole antenna provided in the RFID tag;

L1,L2=inductors representing the loop that couples the strap or chip to the antenna;

Cp=an effective parallel capacitance of the chip on the strap;

Cr=the capacitive coupling values for the coupling between the chip and the rest of the antenna; and Rp=an effective parallel resistance of the chip on the strap.

The dielectric or non-conductive adhesive disposed between the antenna assembly and the strap assembly has a thickness that is sufficient to allow no direct electrical contact between the chip and the antenna yet allow energy to pass thereto. Exemplary thickness range for the non-conductive adhesive is less than or equal to 1 mil (or less than/equal to 25 µm).

In one embodiment, a resonator assembly is coupled to the RFID strap so that the RFID strap can be connected to an antenna assembly with less stringent alignment requirements (with no direct contact). In one embodiment, a small resonator is connected to an RFID integrated circuit provided in an interposer. The resonator is configured such that the inductance in the resonator cancels the chip capacitance of the integrated circuit, thereby enabling coupling of an antenna on a package to the integrated circuit coupled to the resonator, without a direct (or physical) electrical contact.

Figure 15:
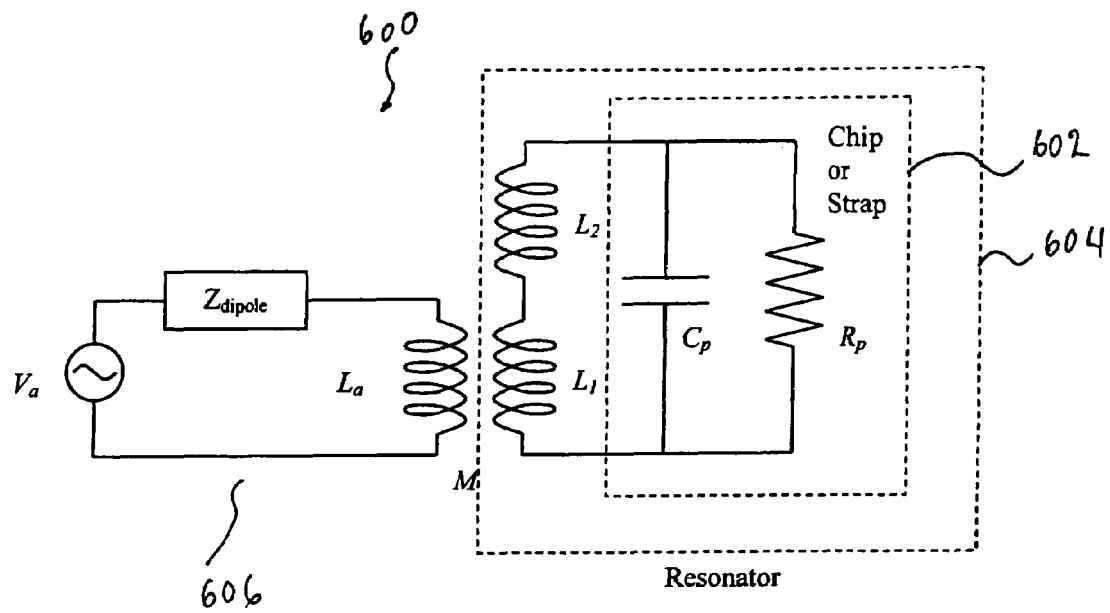
FIG. 15 illustrates an example of an equivalent circuit of an RFID integrated circuit chip coupling to an antenna without a physical or direct contact but with an inductive coupling through a resonator.

FIG. 15 illustrates an equivalent circuit 600 of an RFID tag that has a resonator that is inductively coupled to an antenna provided on a substrate. In this figure, the integrated circuit chip of the RFID tag is connected to a resonator and together the integrated circuit chip and the resonator are placed in close proximity to an antenna to provide an inductive coupling between the antenna and the RFID chip. In this figure, Va=a voltage source that represents the electric field form an antenna;

Zdipole=an impedance of a dipole antenna provided in the RFID tag;

La=an inductor representing the loop from the antenna of the RFID tag;

L1,L2=inductors representing the loop that couples the strap or chip to the antenna;

Cp=an effective parallel capacitance of the chip on the strap;

Rp=an effective parallel resistance of the chip on the strap; and

M=the mutual inductance between the resonator and the rest of the antenna.

The resonator can be placed on an individual substrate (e.g., first substrate) and interconnected to the integrated circuit. The integrated circuit can be placed in another substrate (e.g., second substrate) and interconnects to the resonator. Alternatively, the integrated circuit and the resonator can both be placed or formed on the same substrate (e.g., first substrate or second substrate).

As shown in FIG. 15, an integrated circuit chip 602 is connected or coupled to a resonator 604. The integrated circuit chip 602 has the resistor Rp and the capacitor Cp. The resonator provides the inductors L1 and L2. A mutual inductance exists between the resonator 604, which includes the integrated circuit chip 602, and the antenna 606 as is shown in the figure.

Figure 16:
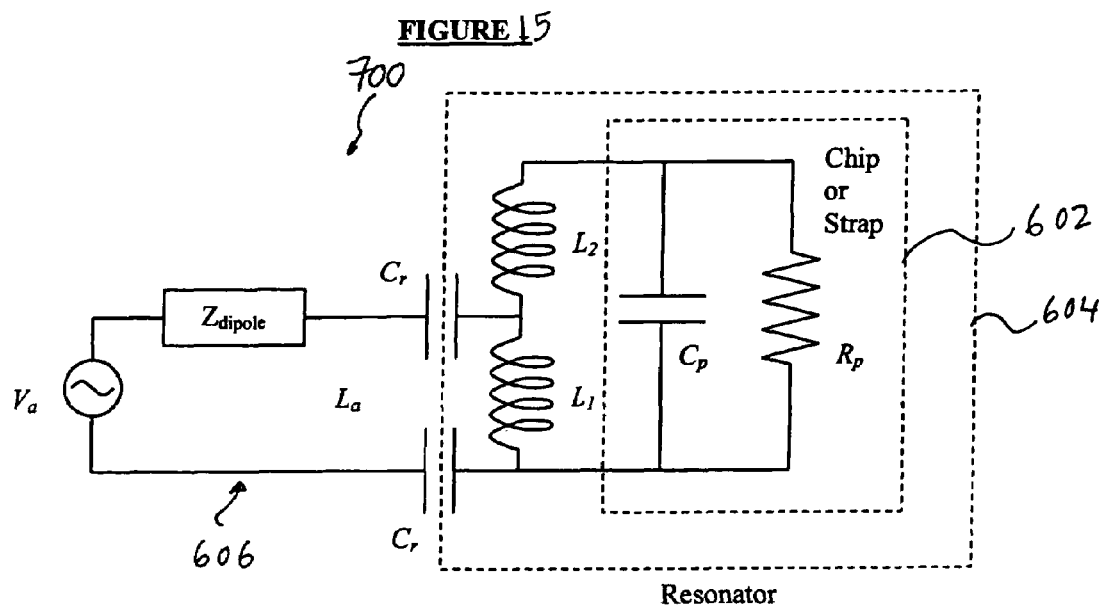
FIG. 16 illustrates an example of an equivalent circuit of an RFID integrated circuit chip coupling to an antenna without a physical or direct contact but with an capacitive coupling through a resonator.

FIG. 16 illustrates an equivalent circuit 700 of an RFID tag that has a resonator that is capacitively coupled to an antenna provided on a substrate. In this figure, the integrated circuit chip of the RFID tag is connected to a resonator and together the integrated circuit chip and the resonator are placed in close proximity to an antenna and separated from the antenna by a dielectric layer so as to form a capacitive coupling between the antenna and the RFID chip. In this figure, Va=a voltage source that represents the electric field form an antenna;

Zdipole=an impedance of a dipole antenna provided in the RFID tag;

La=an inductor representing the loop from the antenna of the RFID tag;

L1,L2=inductors representing the loop that couples the strap or chip to the antenna;

Cp=an effective parallel capacitance of the chip on the strap;

Cr=the capacitive coupling values for the coupling between the resonator and the rest of the antenna; and Rp=an effective parallel resistance of the chip on the strap.

The resonator can be placed on an individual substrate (e.g., first substrate) and interconnected to the integrated circuit. The integrated circuit can be placed in another substrate (e.g., second substrate) and interconnects to the resonator. Alternatively, the integrated circuit and the resonator can both be placed or formed on the same substrate (e.g., first substrate or second substrate).

As shown in FIG. 16, an integrated circuit chip 602 is connected or coupled to a resonator 604. The integrated circuit chip 602 has the resistor Rp and the capacitor Cp. The resonator provides the inductors L1 and L2. A capacitance coupling exists between the resonator 604, which includes the integrated circuit chip 602, and the antenna 606 as is shown in the figure.

Figure 17A:
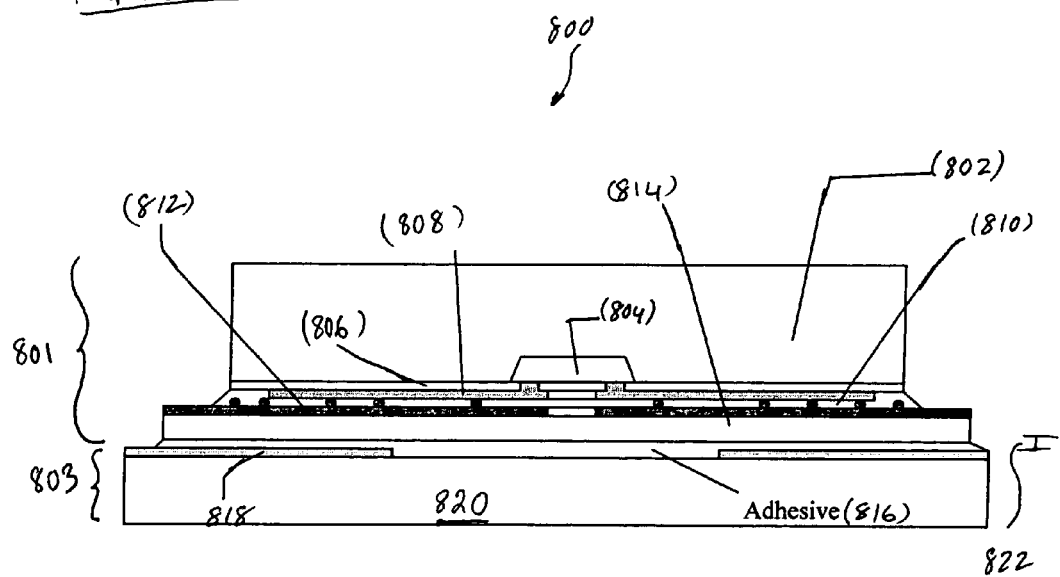
FIGS. 17A-17C illustrate an exemplary structure of an RFID integrated circuit chip coupling to an antenna without a physical or direct contact but with an inductive coupling or a capacitive coupling through a resonator.

FIG. 17A illustrates a cross-sectional view of an RFID tag having a resonator assembly coupling to an antenna assembly. The resonator assembly can be attached to the antenna assembly with an adhesive layer and be coupled inductively or capacitively. In FIG. 17A, an RFID tag 800 is shown. The RFID tag 800 includes a resonator assembly 801 and an antenna assembly 803 to form the RFID tag 800. The resonator assembly 801 comprises a resonator loop 812 and an integrated circuit chip 804. The antenna assembly 803 comprises an antenna element 818 formed on a substrate 820. The substrate 820 can also be referred to as the device substrate.

An adhesive layer 816 is provided for the resonator assembly 801 to be affixed to the substrate 820. The resonator assembly 801 can be inductively coupled to the antenna assembly in that the resonator assembly 801 is placed in proximity to the antenna assembly 803 so that the resonator loop 812 is only in close proximity with the antenna element 818 but not in direct or physical contact.

Alternatively, the adhesive 816 itself can act as a dielectric layer separating the resonator loop 812 and the antenna element 818 so that the resonator loop 812 and the antenna element 818 are capacitively coupled to one another. In one embodiment, the resonator loop 812 is formed on a resonator substrate 814. In such embodiment, the resonator substrate 814 can also act as a dielectric layer separating the resonator loop 812 and the antenna element 818 so that the resonator loop 812 and the antenna element 818 are capacitively coupled to one another. In capacitive coupling, the resonator assembly 801 can be placed so that the resonator assembly 801 overlaps the antenna assembly 803 but still separated by the resonator substrate 814 and/or the adhesive 816, or both.

The integrated circuit chip 804 can be a functional block or a microstructure deposited or embedded in a strap substrate or a carrier substrate 802. The substrate 802 with the integrated circuit chip 804 can be referred to as a strap. The strap can be made using any of the methods previously disclosed or incorporated by references. In one embodiment, the integrated circuit chip 804 is embedded into the substrate 802 using a Fluidic-Self Assembly process. A dielectric layer may be formed over the substrate 802 as shown in FIG. 17A. One or more pad conductors 808 are formed on the substrate 802 to provide convenient interconnections to the integrated circuit chip 804 (through contact pads provide on the chip, tot shown). In one embodiment, the strap is coupled or affixed to the resonator loop using a conductive adhesive 810. In one embodiment, after the resonator loop 812 and the pad conductors 808 are connected to one another, the resonator substrate 814 essentially cover all the functional components of the resonator assembly 801.

Figure 17B:
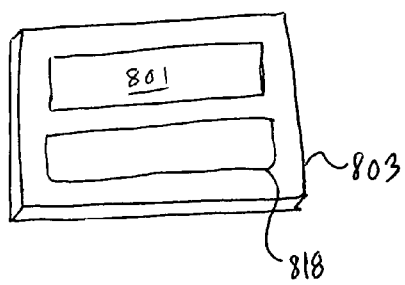
Figure 17C:
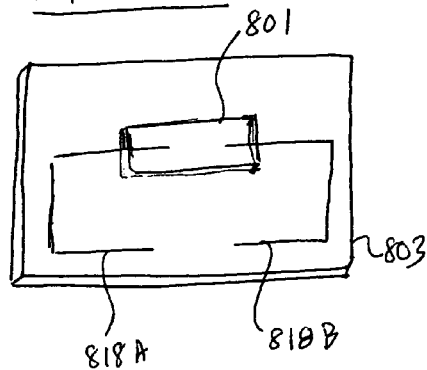

In one embodiment, the resonator assembly 801 is placed in close proximity to then antenna assembly 803 with a distance 822 preventing a physical contact between the two assemblies. In one embodiment, the resonator assembly 801 is placed on the same plane as the antenna assembly 803; and an inductive coupling is formed (FIG. 17B). In another embodiment, the resonator assembly 801 is placed essentially vertically on top the antenna elements 818A and 818B of the antenna assembly 803 with the non-conductive adhesive separating the resonator and the antenna elements to create a capacitive coupling (FIG. 17C).

Figure 18:
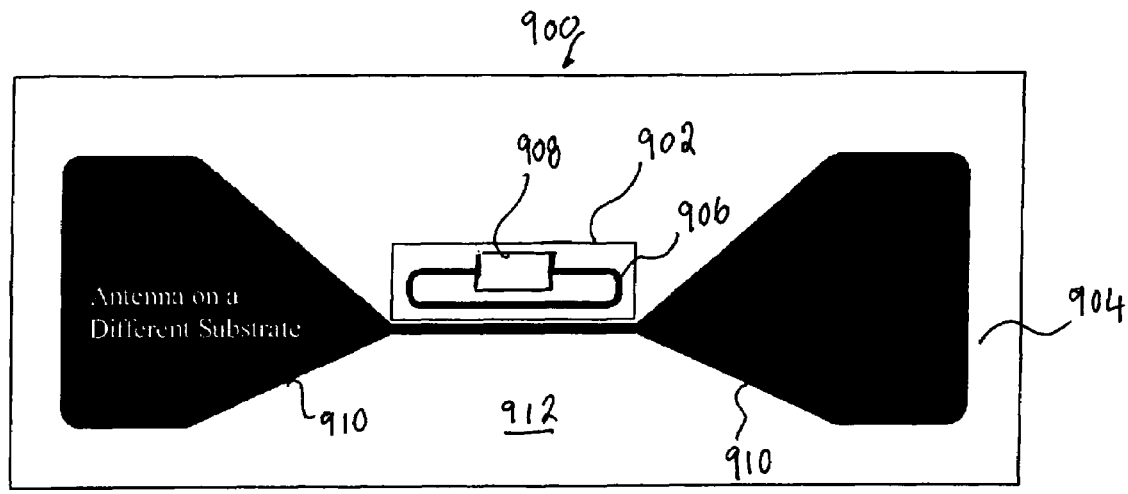
FIGS. 18-19 illustrate in more details the proximate placement of a resonator assembly with an antenna for an inductive coupling.

FIG. 18 illustrates an exemplary embodiment of an assembly that includes a resonator assembly 902 coupled to an antenna assembly 904 to form an RFID tag 900. The resonator assembly 902 comprises a resonator loop 906 and an integrated circuit chip 908. The antenna assembly 904 comprises an antenna element 910 formed on a substrate 912.

The integrated circuit chip 908 is coupled to the resonator loop 906 through various convenient connections. The integrated circuit chip 908 can couple or connect to the resonator loop 906 formed on a first substrate with a flip-chip configuration. For instance, the resonator loop 906 is formed on or in the first substrate and the chip 908 is flipped down and adhered to the surface of the first substrate to make connection to the resonator loop 906. Alternatively, the integrated circuit chip 908 can couple to the resonator loop 906 by conductive attachments, leads, or connections. For instance, the resonator loop 906 is formed on or in the first substrate and the chip 908 is formed in or on a second substrate which is placed in the proximity of the resonator loop 906 and conductive traces or leads are used to connect the chip 908 to the resonator loop 906. The resonator loop 906 can be formed in any suitable patterns, e.g., hot stamped foil strip, razor-like shape, boxes, or patterned foil. Materials such as conductive metal, silver, aluminum, copper, or other conductive material can be used to form the resonator loop 906 using methods such as stamping, printing, or film coating.

The integrated circuit chip 908 can be embedded within or formed on the same substrate (e.g., the first substrate) that the resonator loop 906 is formed on and then be interconnected to the resonator loop 906. The integrated circuit chip 908 can also be formed in an interposer (a second substrate) as previously mentioned (such as forming an RFID strap) and interconnected or coupled to the resonator loop 906 formed on a different substrate (e.g., first substrate).

The antenna element 910 can be formed on the substrate 912 using methods known in the art. The antenna element 910 may be an antenna in any of a variety of suitable configurations. The antenna element 910 may be made of a conductive material, such as a metallic material. The antenna element 910 may formed from conductive ink that is printed or otherwise deposited on the substrate 912. Alternatively, the antenna element 910 may be formed from metal deposited on the substrate 912 by any of a variety of suitable, known deposition methods, such as vapor deposition. As a further alternative, the antenna element 910 may be part of a web of antenna material that is adhered to the substrate 912 by suitable methods, for example, by use of a suitable adhesive in a lamination process. The web of a plurality of antennas may be made from, for example, copper, silver, aluminum or other thin conductive material (such as etched or hot-stamped metal foil, conductive ink, sputtered metal, etc). The antenna element 910 may be formed on a film, coated paper, laminations of film and paper, plastic, polymer, or other suitable substrate. The antenna element 910 can be formed on a packaging of a product using any suitable methods. The antenna element 910 can be formed in, on, or adhere to the substrate 912 which are then affixed or adhered to boxes, packages, covers, foils, items, etc., that have the need for an RFID tag.

Together, the resonator loop coupled to the integrated circuit are referred to as a resonator assembly. The resonator assembly can be made using a web process line similar to previously described for a strap assembly. A plurality of resonator assemblies can be made in high density (or high pitch, which is generally the distance between one assembly to another assembly) on an area of web material. Thus, a high number of resonator assemblies can be formed close to one another (which lower the material cost). A roll of resonator assemblies can be manufactured, rolled up for storage, and singulated to be affixed to an antenna assembly, with or without much alignment or registration. In one embodiment, a raw web material is provided. Integrated circuit blocks are assembled onto or into the web material using methods such as FSA or pick-and-place. Dielectric materials may be formed to insulate and/or planarize the assembled integrated circuit blocks. Pad conductors are then formed to enable electrical interconnections to the integrated circuit blocks. Resonator loops can be formed directly on the web material and connected to the pad conductors. Alternatively, resonator loops can be previously formed or independently formed on another web material and can have the form of a ribbon, tape, or roll. The resonator loops (and its web) are then laminated to the web material with the integrated circuit blocks so as to connect the resonator loops to the respective pad conductors. At this point, the resonator assemblies are formed and ready to be assembled or connected to antenna assemblies.

It is to be appreciated that the pitch of the resonator assemblies formed on a web material may have a different pitch compared to the pitch of the antenna assemblies. The resonator assemblies can be formed very close to one another resulting in a higher density number per area of web material. In other words, a higher or much higher number of resonator assemblies are formed per area of web material compared to a smaller number of antenna assemblies being formed per comparable area of web material). In one embodiment, there are about 5-20 units of resonator assemblies formed per square inch of web materials. It is to be understood that 5-20 units per square inch is only an example for illustration purpose, more or less may be formed in a square inch area depending on applications, materials, and fabrication process. Thus, cutting and singulating, or otherwise coupling the resonator assemblies to the resonator assemblies may involve the appropriate indexing, registration, matching, and cutting.

As shown in FIG. 18, in one embodiment, the resonator assembly 902 is placed in proximity to an antenna assembly 904 formed on a different substrate 912 to form the RFID tag 900. In this embodiment, an inductive coupling is created between the integrated circuit 908 and the antenna 910. No direct physical interconnection is required. With proximity placement being the only requirement with respect to alignment for proper coupling between the resonator assembly 902 and the antenna assembly 904, it becomes less expensive and much easier to complete the final step of assembling or forming an RFID tag. For example, the manufacturer of product that has the need for the RFID tag can have the product includes the antenna assembly (which can be cheaply made) and all that is required is for the manufacture to obtain a resonator assembly and affix the resonator assembly in a close proximity to the antenna assembly on the product. Alternatively, many current manufacturing systems can be used to complete the final assembling of the RFID tag with minimal or no modification to accommodate a stringent alignment or registration requirement.

Figure 19:
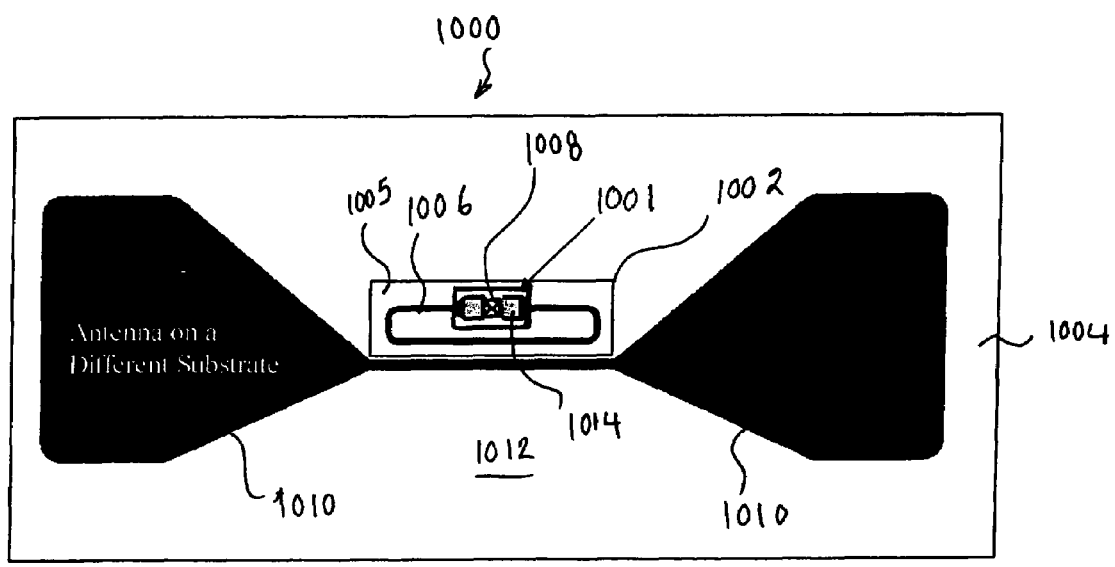

FIG. 19 illustrates another exemplary embodiment of inductive coupling between a resonator assembly 1002 and an antenna assembly 1004 to form an RFID tag 1000. The resonator assembly 1002 comprises a resonator loop 1006 and an integrated circuit chip 1008. The antenna assembly 1004 comprises an antenna element 1010 formed on a substrate 1012 similar to the antenna assembly 904. The RFID tag 1000 is similar to the RFID tag 900 in FIG. 18 with the addition that the integrated circuit chip 1008 is formed in an interposer or a strap 1001, which is attached to or placed on a substrate 1005 that the resonator loop 1006 is formed in or on.

As before, the integrated circuit chip 1008 is coupled to a resonator loop through various convenient connections. The integrated circuit chip 1008 can couple or connect to the resonator loop 1006 formed on a first substrate 1005 with a flip-chip configuration. The resonator loop 1006 is formed on or in the first substrate and the chip 1008 is flipped down and adhered to the surface of the first substrate to make connections to the resonator loop 1006. Alternatively, the integrated circuit chip 1008 can couple to the resonator loop 1006 by conductive attachments, leads, or connections. For example, the chip 1008 includes contact pads which are further connected to larger pad conductors 1014 provided on the interposer 1001 substrate, which are then further connected to the resonator loop 1006. The resonator loop 1006 and the chip 1008 formed in or on a second substrate is placed in the proximity of the resonator loop 1006 and conductive traces or leads can be used to connect the chip 1008 to the resonator loop 1006. The interposer 1001 is also adhered or otherwise laminated to the resonator substrate 1005 and interconnections established. Method of forming an interposer that includes an RFID integrated circuit can be found in U.S. Pat. Nos. 5,782,856; 5,824,186; 5,904,545; 5,545,291; 6,274,508; and 6,281,038, and U.S. application Ser. Nos. 11/159,550; 11/139,526; and 11/159,574, which are all hereby incorporated by reference in their entireties.

The antenna element 1010 can be formed on the substrate 1012 using methods known in the art similar to the antenna element 910. The antenna 1010 may be an antenna in any of a variety of suitable configurations. The antenna 1010 may be made of a conductive material, such as a metallic material. The antenna 1010 may formed from conductive ink that is printed or otherwise deposited on the substrate 1012. Alternatively, the antenna 1010 may be formed from metal deposited on the substrate 1012 by any of a variety of suitable, known deposition methods, such as vapor deposition. As a further alternative, the antenna 1010 may be part of a web of antenna material that is adhered to the substrate 1012 by suitable methods, for example, by use of a suitable adhesive in a lamination process. The web of a plurality of antennas may be made from, for example, copper, silver, aluminum or other thin conductive material (such as etched or hot-stamped metal foil, conductive ink, sputtered metal, etc.). The antennas 1010 may be on a film, coated paper, laminations of film and paper, or other suitable substrate. The antenna element 1010 can be formed on a packaging of a product using any suitable methods.

As shown in FIG. 19, and similar to FIG. 18, the resonator assembly 1002 is placed in proximity to an antenna assembly 1004 formed on a different substrate 1012 to form the RFID tag 1000. In this embodiment, an inductive coupling is created between the integrated circuit 1008 and the antenna 1010. No direct physical interconnection is required.

Figure 20:
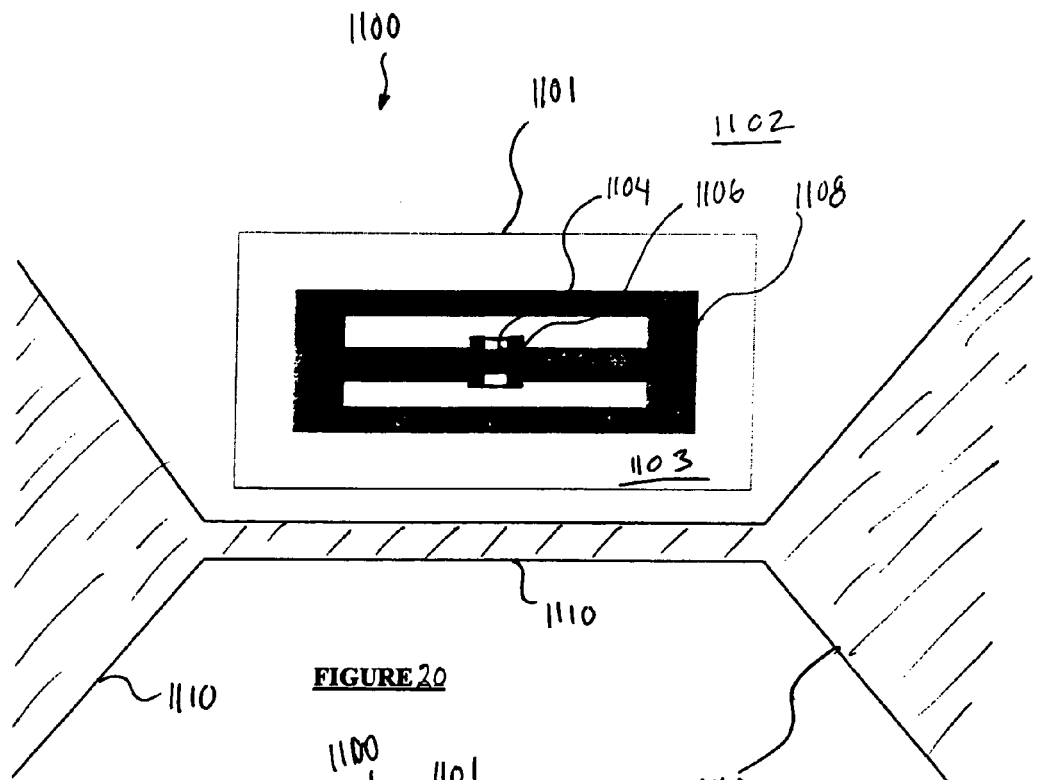
FIGS. 20-21 illustrate exemplary embodiments of a strap that includes both an RFID integrated circuit chip and a resonator loop formed therein or thereon and an inductive coupling of the chip to an antenna.
Figure 21:
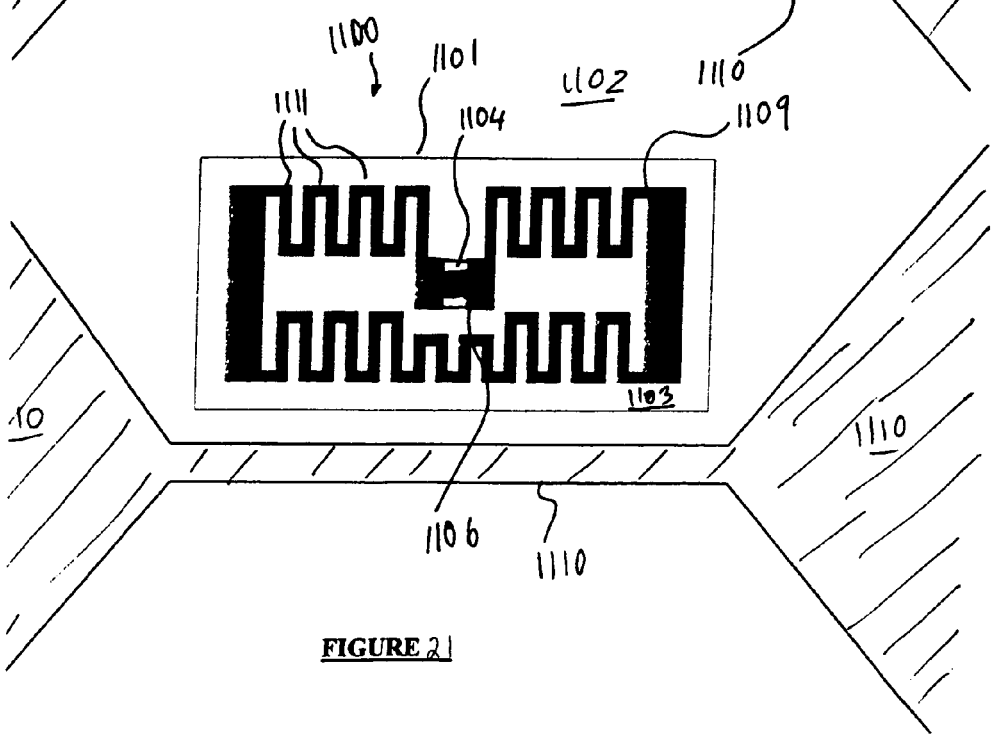

In one embodiment, a current configuration of an RFID strap is modified so that the strap itself can be made to include a resonator loop formed thereon. As previously discussed, a strap assembly includes an integrated circuit block in a substrate and pad conductors formed on the substrate and connected to the integrated circuit blocks. The strap assembly can further include a resonator loop so that the strap assembly itself can be inductively or capacitively coupled to an antenna assembly without a direct (or physical/contact) connection. FIGS. 20-21 illustrate exemplary embodiments of forming a resonator loop directly on an interposer (RFID strap) that includes a resonator loop incorporated therein.

FIG. 20 illustrates an exemplary embodiment of a strap 1101 that includes a resonator loop formed therein/thereon. In one embodiment, the strap 1101 replaces the resonator assembly 902 shown in FIG. 18 and the resonator assembly 1002 shown in FIG. 19. Thus, instead of having two separate substrates, a first substrate for the resonator loop and a second substrate for the RFID integrated circuit, there is only one substrate in the strap 1101 shown in FIG. 20.

In FIG. 20, an RFID tag includes a substrate 1102 having printed thereon or therein an antenna element 1110. A strap 1101 is placed in close proximity with the antenna element 1110 and can also be place on the substrate 1102 (but need not to). The strap 1101 is placed in a location such that a resonator loop 1108 formed on a strap substrate 1103 is in close proximity to the antenna element 1110 for an inductive coupling. The strap 1101 includes the strap substrate 1103, the resonator loop 1108, and RFID integrated circuit 1104, and pad conductors 1106. The RFID integrated circuit 1104 can be embedded within a receptor provided on the strap substrate 1101 as previously disclosed. The RFID integrated circuit 1104 can also be attached, placed, affixed, or otherwise secured to the strap substrate 1101 using other suitable methods. The RFID integrated circuit 1104 include contact pads (not shown) which are connected to pad conductors formed on the strap substrate 1101 to allow the RFID integrated circuit 1104 to be electrically coupled to external conductive elements (e.g., antenna).

As shown in FIG. 20, the pad conductors 1106 are connected to the portions of the resonator loop 1108. The resonator loop 1108 can be formed to have any suitable pattern to allow efficient transfer of energy and inductive coupling to the antenna element 1110. As shown in FIG. 20, the resonator loop 1108 has a boxed-like loop shape. In one embodiment, the shape of the resonator loop 1108 is selected so that it is suitable for a operation at a particular frequency range, for example, about 2.45 GHz range for a strap 1101 of a size about 9×4.5 mm.

The substrate 1102 can be the packaging of a product (e.g., a box or cover). The substrate 1102 can also be a label that is affixed to a location on the packaging of a product. The substrate 1102 can also be made to include an adhesive label or other material to allow the placement of the substrate 1102 to a product. The strap 1101 with resonator loop 1108 can be sized so that it is no larger in size or area than a postage stamp or the like.

FIG. 21 illustrates another exemplary embodiment of a strap that includes a resonator loop formed therein/thereon. In the present embodiment, a strap 1101 replaces the resonator assembly 902 shown in FIG. 18 and the resonator assembly 1002 shown in FIG. 19. The strap 1101 in FIG. 21 is similar to the strap 1101 previously described with respect to FIG. 20 with the exception of the shape of the resonator loop.

In FIG. 21, an RFID tag includes a substrate 1102 having printed thereon or therein an antenna element 1110. A strap 1101 is placed in close proximity with the antenna element 1110 and can also be place on the substrate 1102 (but need not to). The strap 1101 is placed in a location such that a resonator loop 1109 formed on a strap substrate 1103 is in close proximity to the antenna element 1110 for an inductive coupling. The strap 1101 includes the strap substrate 1103, the resonator loop 1109, and RFID integrated circuit 1104, and pad conductors 1106. The RFID integrated circuit 1104 can be embedded within a receptor provided on the strap substrate 1101 as previously disclosed. The RFID integrated circuit 1104 can also be attached, placed, affixed, or otherwise secured to the strap substrate 1101 using other suitable methods. The RFID integrated circuit 1104 include contact pads (not shown) which are connected to pad conductors formed on the strap substrate 1101 to allow the RFID integrated circuit 1104 to be electrically coupled to external conductive elements (e.g., antenna).

As shown in FIG. 21, the pad conductors 1106 are connected to the portions of the resonator loop 1109. The resonator loop 1109 is formed with many folds or loops to allow the inductance of the loop to be large enough to cancel the capacitance of the chip. As shown in FIG. 21, the resonator loop 1109 has a plurality of folded sections 1111 which gives the resonator loop 1109 greater surface area. In the present embodiment, the shape of the resonator loop 1109 is selected so that it is suitable for a operation at a particular frequency range, for example, about 915 MHz range for a strap 1101 of a size about 9×4.5 mm.

As before, the substrate 1102 can be the packaging of a product (e.g., a box or cover). The substrate 1102 can also be a label that is affixed to a location on the packaging of a product. The substrate 1102 can also be made to include an adhesive label or other material to allow the placement of the substrate 1102 to a product. The strap 1101 with resonator loop 1108 can be sized so that it is no larger in size or area than a postage stamp or the like.

Figure 22:
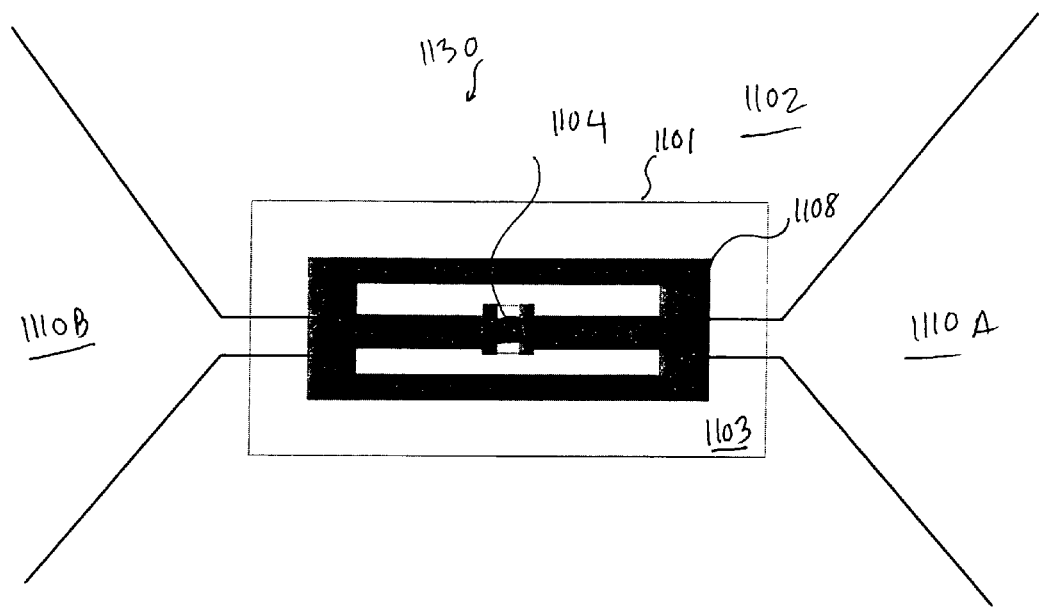
FIGS. 22-23 illustrate exemplary embodiments of a strap that includes both an RFID integrated circuit chip and a resonator loop formed therein or thereon and an inductive coupling of the chip to antenna elements.

FIG. 22 illustrates the same strap 1101 as shown in FIG. 20. However, the strap 1101 is capacitively coupled to the antenna elements 1110A and 1110B to form an RFID device 1130. A non-conductive adhesive layer (not shown) is placed between the strap 1101 or at least to cover the resonator loop 1108 and the antenna elements 110A-1110B so that the strap 1101 and the functional components (chips 1104 and resonator loop 1108) are capacitively coupled to the antenna elements.

Figure 23:
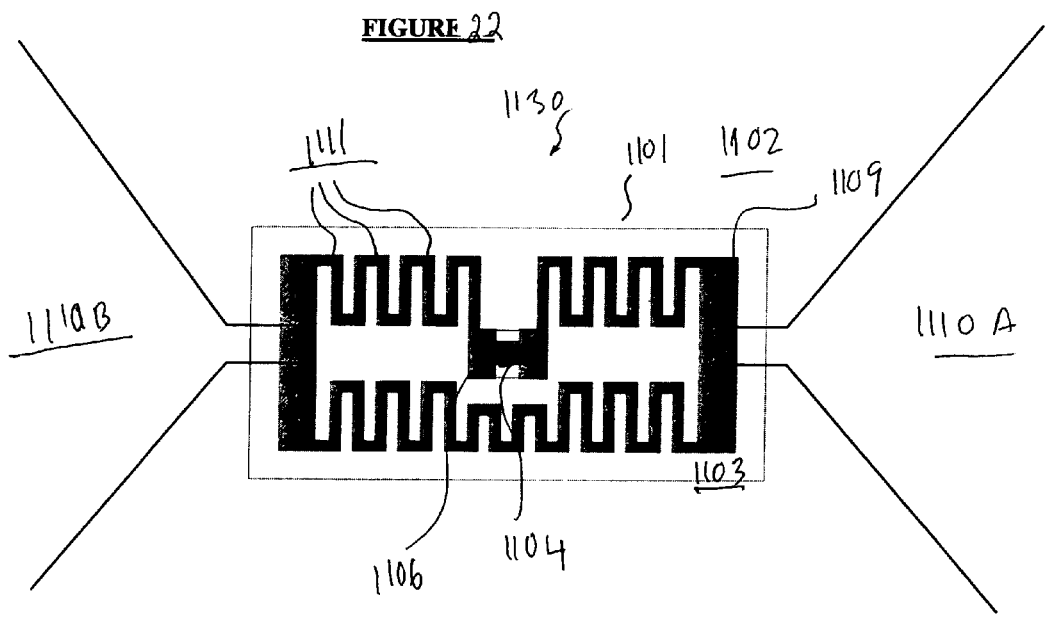

FIG. 23 illustrates the same strap 1101 as shown in FIG. 21 with the strap 1101 being capacitively coupled to the antenna elements 1110A-110B to form an RFID device 1130.

The combination of the resonator loop 1108 formed on the strap 1101 and the capacitive coupling enable non-rigid alignment (since the conductive elements do not need to make physical/direct contact) of the strap assembly 1101 to the antenna while providing sufficient electrical coupling for a functional RFID device.

Figure 24:
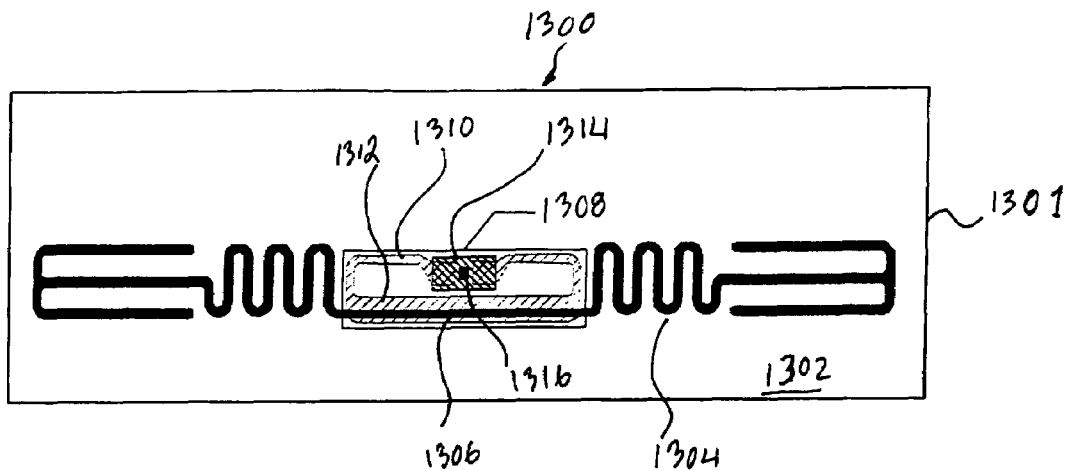
FIGS. 24-27 illustrate various placement of a resonator assembly with an antenna for an inductive or capacitive coupling.

FIG. 24 illustrates an exemplary embodiment of an inductive coupling between a resonator assembly 1308 and an antenna assembly 1301. In the present embodiment, the antenna assembly 1301 can placed so that a portion of an antenna element 1304 overlaps with a portion of a resonator loop 1310. Additionally, the portion of the resonator loop 1310 that overlaps with the portion of the antenna 1302 can be made larger, significantly larger (e.g., two times to five times) or have greater width (e.g., two times to five times) as shown in the example of FIG. 24. Greater or larger portion permits a greater positional variability in the placement of the resonator loop 1310 to be in proximity with the antenna element 1304.

In more details, an RFID device 1300 of FIG. 24 is formed when the resonator assembly 1308 is inductively coupled to the antenna assembly 1301. As before, the resonator assembly 1308 includes a strap 1314, which has an RFID chip 1316 included therein, and a resonator loop 1310 formed on a substrate. The resonator loop 1310 is connected to the chip 1316 through conductive elements such as contact pads (not shown) provided on the chip 1316 and the pad conductors (not shown) formed on the strap 1314. The antenna assembly 1301 includes a device substrate 1302 with the antenna element or loop 1304 formed therein or thereon. In the embodiment illustrated in FIG. 24, the resonator loop 1304 includes a portion 1312 that is larger or substantially larger in width compared to the rest of the resonator loop 1310. In one embodiment, the resonator assembly 1308 is placed in proximity with the antenna assembly 1301 with the portion 1312 overlapping a portion 1306 of the antenna loop 1304. The resonator loop 1310 needs not to overlap the antenna element for a coupling to occur as illustrated in FIG. 25.

Figure 25:
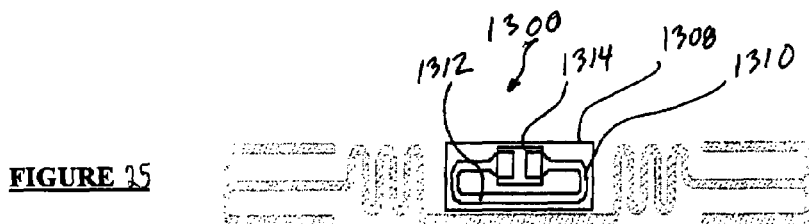

FIG. 25 illustrates an exemplary embodiment of another inductive coupling between a resonator assembly and an antenna assembly. In the present embodiment, the antenna assembly is placed close to or proximate to a portion of a resonator loop. Although not shown in FIG. 25, the portion of the resonator loop that is near the portion of the antenna can also be made larger, significantly larger (e.g., two times to five times) or have greater width (e.g., two times to five times) as shown in the example of FIG. 25. Greater or larger portion permits a greater positional variability in the placement of the resonator loop to be in proximity with the antenna element.

Comparing the embodiment of FIG. 25 to the embodiment shown in FIG. 24, there is no overlapping placement between the resonator assembly and the antenna assembly in FIG. 25. In the present embodiment, resonator loop couples to the antenna element inductively by just being close to the each other.

In more details, an RFID device 1300 of FIG. 25 is formed when the resonator assembly 1308 is inductively coupled to the antenna assembly 1301 simply by being close to the antenna assembly 1308. The RFID device 1300 in FIG. 25 is similar to that in FIG. 24 except for the proximity of the resonator assembly to the antenna assembly. The resonator assembly 1308 includes a strap 1314, which has an RFID chip 1316 included therein, and a resonator loop 1310 formed on a substrate. The resonator loop 1310 is connected to the chip 1316 through conductive elements such as contact pads (not shown) provided on the chip 1316 and the pad conductors (not shown) formed on the strap 1314. The antenna assembly 1301 includes a device substrate 1302 with the antenna element or loop 1304 formed therein or thereon. The resonator loop 1304 may include a portion 1312 that is larger or substantially larger in width compared to the rest of the resonator loop 1310. Additionally, the antenna loop 1304 may also include a portion 1306 that is larger or substantially larger in width compared to the rest of the antenna loop 1304. In one embodiment, the resonator assembly 1308 is placed in proximity with the antenna assembly 1301 with no overlapping.

Figure 26:
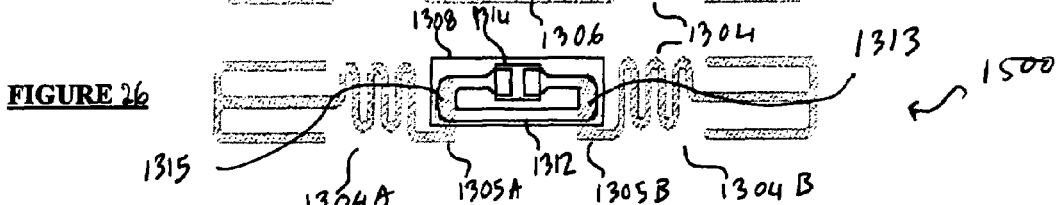

FIG. 26 illustrates an exemplary embodiment of a capacitive coupling between a resonator assembly and an antenna assembly. In the present embodiment, the antenna assembly is placed in an overlapping manner with respect to a resonator assembly. In one embodiment, a portion of the resonator loop is placed so that it overlaps (but not direct contact as there is a dielectric layer, a substrate, or an adhesive layer separating the resonator loop and the antenna loop, previously discussed, FIG. 17A). Additionally, the portion of the resonator loop that overlaps with the portion of the antenna can also be made larger, significantly larger (e.g., two times to five times) or have greater width (e.g., two times to five times) as shown in the example of FIG. 26. Greater or larger portions permit a greater positional variability in the placement of the resonator loop to be overlapped with the antenna elements for a capacitive coupling. It is also desirable to have a larger overlap area for increased capacitive coupling.

In one embodiment, the capacitive coupling between the resonator loop and the antenna element is accomplished with overlapping lobes at the ends of the antenna element. Further, the antenna element comprises two sections, each with one end overlapping a lobe of the resonator loop as shown in the figure.

In more details, an RFID device 1500 of FIG. 26 is formed when the resonator assembly 1308 is capacitively coupled to the antenna assembly 1301. Similar to before, the resonator assembly 1308 includes a strap 1314, which has an RFID chip 1316 included therein, and a resonator loop 1310 formed on a substrate. The resonator loop 1310 further includes a lobe 1315 and a lobe 1313, and a middle portion 1312. As before, the resonator loop 1310 is connected to the chip 1316 through conductive elements such as contact pads (not shown) provided on the chip 1316 and the pad conductors (not shown) formed on the strap 1314. The antenna assembly 1301 includes a device substrate 1302 with two antenna elements 1304A and 1304B formed therein or thereon. The resonator loop 1310's lobes 1315 and 1313 may be made larger or substantially larger in width compared to the rest of the resonator loop 1310. Additionally, the antenna elements 1304A and 1304B each may also include a portion 1305A and 1305B that is larger or substantially larger in width compared to the rest of the antenna element. In one embodiment, the lobe 1315 of the resonator loop 1310 overlaps with the portion 1305A of the antenna element 1304A; and the lobe 1313 of the resonator loop 1310 overlaps with the portion 1305B of the antenna element 1304B.

Figure 27:
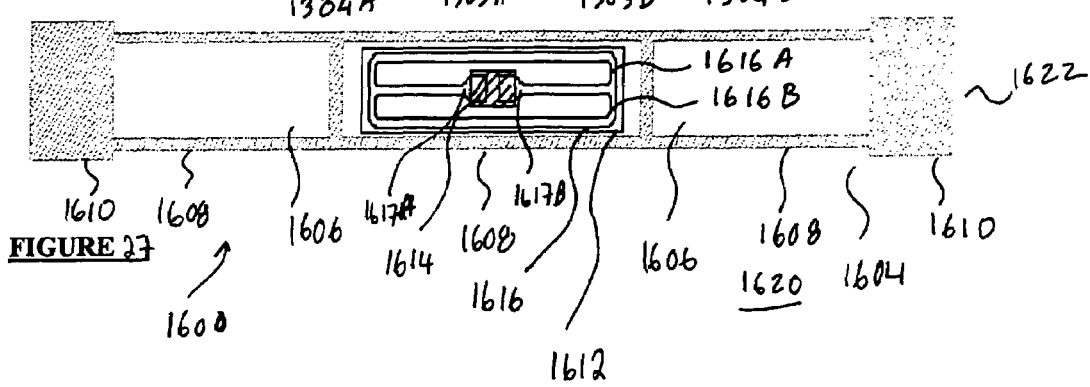

FIG. 27 illustrates an exemplary embodiment of an inductive coupling between a resonator assembly and an antenna assembly. In addition, the resonator assembly comprises a double inductor loop, which can be used to reduce placement inaccuracy with respect to the antenna assembly. The resonator structure with a double inductor loop may be referred to as a resonator with a double-loop configuration since there are at least two loops comprised within the resonator structure. The resonator assembly in the present embodiment can be larger than those previously discussed to accommodate the double resonator loops. In one embodiment, the resonator assembly can be placed in the middle of the antenna assembly as shown in the example in FIG. 27. The resonator assembly can also be placed in proximity to the antenna similar to previously discussed.

In more details, an RFID device 1600 of FIG. 27 is formed when the resonator assembly 1612 is inductively coupled to the antenna assembly 1604 by being placed in close proximity to the antenna assembly 1604. The resonator assembly 1612 includes a strap 1614, which has an RFID chip (not labeled) included therein, and a resonator structure 1616 formed on a substrate. The resonator structure 1616 comprises of two resonator loops 1616A and 1616B. The resonator structure 1616 is connected to the chip through conductive elements 1617A and 1617B such as through contact pads (not shown) provided on the chip and the pad conductors (not shown) formed on the strap 1314. The antenna assembly 1604 may include a device substrate 1620 with the antenna element or loop 1622 formed therein or thereon. The antenna loop 1622 may be comprised of an opening 1608, sidewalls 1610, and sides 1808. The resonator assembly 1612 can be placed within a portion 1606 (as illustrated in the example in FIG. 27) or be placed proximate to the antenna structure 1622 for an inductive coupling between the resonator assembly and the antenna assembly to form the RFID device.

As previously mentioned, a resonator assembly can be made using web processing method. It is desirable to test the function of the resonator assembly prior to coupling it to another device. In one embodiment, the resonator assembly includes an RFID integrated circuit chip and interconnections such as pad conductors that connect the chip to a respective resonator loop. As illustrated in FIGS. 28-29, a plurality of resonator assemblies are formed on a section of a web material. A test apparatus is provided so that all of the resonator assemblies can be tested prior to assembling them to a final device to form RFID devices.

FIG. 28 illustrates inductively coupled resonator assemblies 1700 on a web material 1702 while the resonator assemblies 1700 are being tested. FIG. 29 illustrates capacitively coupled resonator assemblies 1800 on a web material 1802 while the resonator assemblies 1800 are being tested. In one embodiment, a plurality of resonator assemblies (e.g., 1700 or 1800) are formed on a section of a web material (e.g., 1702 or 1802). For each resonator assembly, the RFID integrated circuit is on a strap which is shown as a rectangle 1900 in FIGS. 28-29 and each resonator loop (e.g., 1704 or 1804) in each resonator assembly is electrically coupled (e.g., a DC, resistive coupling, inductive coupling, or capacitive coupling) to its corresponding RFID integrated circuit on the resonator assemblies. The resonator loop coupled to the integrated circuit in the strap is referred to as a resonator assembly.

It is desirable that the resonator assemblies on the web material (in a roll to roll manufacturing process) are being tested before they are each applied to an antenna on a different substrate. In an exemplary embodiment shown in FIG. 28, a test board 1706 is provided for testing the resonator assemblies 1700. The test board 1706 comprises a plurality of functional test lines 1708. In one embodiment, the functional test lines 1708 are formed or provided on a printed circuit board (or the test board 1706) where the circles are vias 1710 allowing electrical interconnection down to and RF current source and RF ground. The functional test lines 1708 are thus electrically interconnectable to the respective resonator loops 1704 through the vias 1710. In one embodiment, the resonator loops 1704 are positioned over the test lines 1708 on the test board 1706 and are tested from the inductive coupling or other desirable functional tests.

In an exemplary embodiment shown in FIG. 29, a test board 1806 is provided for testing the resonator assemblies 1800. The test board 1806 comprises a plurality of functional test features or elements 1808. In one embodiment, the functional test features or elements 1808 are formed or provided on a printed circuit board (or the test board 1806) where the circles are vias 1810 allowing electrical interconnection down to and RF current source and RF ground. The functional test elements 1808 are thus electrically interconnectable to the respective resonator loops 1804 through the vias 1810. In the present embodiment, the test features 1808 are interconnected to the respective resonator loops 1804 through capacitive couplings as previously discussed. In one embodiment, the resonator loops 1804 are positioned to be contacting the test features 1808 on the test board 1806 and are tested from the capacitive coupling or other desirable functional tests.

In another embodiment, (FIG. 20), a test board 1850 is provided for testing a plurality of strap assemblies 1853, each with a functional block 1855, through capacitive couplings. For a testing procedure, the test board can be placed over a plurality of strap assemblies 1853 formed on a substrate and test for the functionality of the active components of the strap assemblies via capacitive coupling. The test board 1850 comprises a plurality of test elements 1851. A dielectric layer (not shown) may be provided on the test board 1850 so that the test elements 1851 do not directly contact the conductive elements 1857 of the strap assemblies 1853. The strap assemblies 1853 can each include a dielectric layer 1859 so that the conductive element s 1857 coupled to the test elements 1851 through capacitive couplings with no direct contact.

It can be envisioned that the resonator assemblies are formed on a web processing line and tested on the same line at a test station equipped with the appropriate test boards. Thus, the resonator assemblies may be functionally tested prior to being separated or cut and assembled with antenna assemblies to form RFID devices.

In one embodiment, the resonator can be applied to the antenna assembly provided on a packaging or a cover of an item with an adhesive coverlay with a release layer on the top of the resonator assembly, such that the resonator assembly is attached with the integrated circuit chip facing the antenna. Alternatively, the adhesive could be on the back side of the resonator.

In one embodiment, the antenna element is designed to be resonant at the same given frequency (usually close to the design frequency, but not exactly) as the integrated circuit chip. In such embodiment, one can adjust the match of the two resonant circuits of the antenna element and the integrated circuit by adjusting their coupling and fine tuning the resonance.

In any of the embodiments of the present invention, the antenna element can be affixed to a packaging of an item, or can be the item itself. For instance, the antenna element can be a metal or conductive structure already existed in a particular product, such as a foil seal of a bottle, a foil label, a section of a metal-containing device (e.g., a CD-ROM), a razor, or a medicine cap, etc. The resonator assembly can then be inductively coupled or capacitively coupled to the antenna element as previously described.

FIGS. 31A-31D illustrate an exemplary embodiment where a conductive layer is printed (e.g., by using a local printing process and optionally, with the assistance of a guidance system) into a receptor site provided on a strap substrate. At FIG. 31A, a strap substrate or a strap substrate web 5002 is provided. A receptor site 5004 or a plurality of receptor sites 5004 is created into the strap substrate 5002 as previously described. A conductive layer 5006 is printed into the receptor site 5004. The substrate 5002 is then subjected to an FSA process for the deposition of a functional block or a plurality of functional blocks 5008 (FIG. 31B). The functional block includes one or more contact pads 5010 which make contact to the conductive layer 5006. At this point, a strap assembly 5000 is formed and can be coupled, adhered, or laminated to another device, for example, so as to make an RFID tag.

An interconnection is created between the conductive layer 5006 and another element 5012 (FIG. 31C). Through this interconnection, the functional block 5008 is also interconnected to the element 5012. The element 5012 enables the functional block 5008 to be electrically connected to another device such as an antenna formed on a second substrate or a device substrate. In one embodiment, the element 5012 is formed on a second substrate 5014 or a substrate web. When the second substrate 5014 and the strap assembly 5000 are coupled together, a device 5001 is formed with the element 5012 and the functional block 5008 electrically interconnected as shown in FIG. 31D. In one embodiment, the second substrate 5014 is an antenna substrate and the element 5012 comprise antenna elements formed on the second substrate 5014. As shown in these exemplary embodiments, the conductive layer 5006 is formed in the receptor site 5004 with an extension 5007 that allows it to easily couple to other element such as element 5012. In one embodiment, the element 5012 is capacitively and/or inductively coupled to the antenna element on the second substrate 5014 similar to previously discussed. A non-conductive adhesive layer may be provided as previously discussed for a capacitive coupling. For an inductive coupling, a resonator loop or assembly is provided as previously discussed.

In designing the antennas for any of the embodiments of the present invention, the antenna elements can be modeled in a 2-D or 3-D antenna modeling software. This allows for optimization of the antenna/loop designs over a given frequency range. After the modeling is correct, a prototype antenna with slight variation can be built and the best one selected. Further iteration prototype antennas can be built with slight dimensional changes until the optimum design is achieved.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A device comprising:
    an antenna assembly comprising a first substrate and antenna elements;
    a strap assembly overlaying and affixed to said antenna assembly, the strap assembly comprising a second substrate having an integrated circuit embedded within the second substrate, wherein the integrated circuit comprises one or more contact pads, and wherein said integrated circuit being substantially flush with a surface of the second substrate, and interconnections are connected to the integrated circuit through the one or more contact pads, said interconnections being formed on said surface of said second substrate, and wherein the interconnections are substantially larger than the one or more contact pads; and
    a non-conductive layer disposed between antenna elements and said interconnections to allow said antenna elements to capacitively couple to said interconnections, wherein said antenna assembly and said strap assembly are affixed to one another with said surface of said second substrate facing said antenna elements and said antenna elements capacitively coupled to said integrated circuit without direct physical contact between the antenna elements and the integrated circuit.

2. The device of claim 1, wherein said device is an RFID device.

3. The device of claim 1, wherein said interconnections comprising:
    a resonator assembly interconnected to said integrated circuit and capacitively coupled to said antenna elements.

4. The device of claim 3, wherein said resonator assembly is formed directly on said surface of said second substrate.

5. The device of claim 4, wherein said resonator assembly comprises a resonator loop having any one of a loop configuration, a box configuration, a double-loop configuration, and a multi-folded loop configuration.

6. The device of claim 5, wherein said antenna assembly further comprises at least two antenna elements isolated from one another and wherein each one of said antenna element includes a portion that is capacitively coupled to said resonator loop.

7. The device of claim 1, further comprising:
    a resonator assembly interconnected to said integrated circuit and capacitively coupled to said antenna elements; and
    a third substrate with a resonator loop formed thereon to form said resonator assembly, wherein said strap assembly is affixed to said third substrate with said resonator loop interconnecting to said integrated circuit.

8. The device of claim 7, wherein said resonator assembly comprises a resonator loop having any one of a loop configuration, a box configuration, a double-loop configuration, and a multi-folded loop configuration.

9. The device of claim 7, wherein said antenna assembly further comprising at least two antenna elements not in physical contact to one another and wherein each one of said antenna element includes one end that is capacitively coupled to said resonator loop.

10. A label comprising:
    a strap assembly comprising a first substrate having an integrated circuit embedded within said first substrate and substantially flush with a surface of said first substrate, wherein the integrated circuit comprises one or more contact pads, and interconnections are formed to contact the one or more contact pads of the integrated circuit, said interconnections being formed on said surface of said first substrate, and wherein the interconnections are substantially larger than the one or more contact pads; and a double sided non-conductive adhesive having a release liner, said double sided non-conductive adhesive being placed over said surface; wherein a second substrate having formed thereon antenna elements, the second substrate overlaying and affixed to the strap assembly by said double sided non-conductive adhesive after removal of the release linear, wherein said antenna elements and said interconnections are capacitively coupled without direct physical contact and through said non-conductive adhesive.

11. The label of claim 10, wherein said second substrate is any one of a packaging of an item, a jacket of an item, an item, and a label of an item.

12. The label of claim 10 further comprising:
a resonator assembly interconnected to said integrated circuit and capacitively coupled to said antenna elements.

13. The device of claim 12, wherein said resonator assembly is formed directly on said surface of said first substrate.

14. The device of claim 13, wherein said resonator assembly comprises a resonator loop having any one of a loop configuration, a box configuration, a double-loop configuration, and a multi-folded loop configuration.

15. The device of claim 10 further comprising:
a resonator assembly interconnected to said integrated circuit and capacitively coupled to said antenna elements; and a third substrate with a resonator loop formed thereon to form said resonator assembly, wherein said strap assembly is affixed to said third substrate with said resonator loop interconnecting to said integrated circuit.

16. The device of claim 15, wherein said resonator assembly comprises a resonator loop having any one of a loop configuration, a box configuration, a double-loop configuration, and a multi-folded loop configuration.

17. The device of claim 10, wherein said antenna assembly further comprising at least two antenna elements not in physical contact to one another and wherein each one of said antenna element includes one end that is capacitively coupled to said resonator loop.

18. A device comprising:
an antenna assembly comprising a first substrate and antenna elements; and
a strap assembly attached to and overlaying at least part of the antenna assembly, the strap assembly comprising
a second substrate having an a receptor region;
a conductive layer formed over at least a portion of said receptor region; and
an integrated circuit embedded within said receptor region and over said conductive layer, wherein the integrated circuit comprises one or more contact pads, and wherein the integrated circuit being substantially with a surface of said second substrate; and,
interconnections are coupled to the integrated circuit through the one or more contact pads, said interconnections being formed on said surface of said second substrate, and wherein the interconnections have areas substantially larger than areas of the one or more contact pads;

wherein said antenna assembly is capacitively coupled to said integrated circuit without direct physical contact between the antenna elements and the integrated circuit; and through a non-conductive layer disposed between said antenna elements and said interconnections.

19. The device of claim 18 further comprising:
a resonator assembly interconnected to said integrated circuit and capacitively coupled to said antenna elements.

20. The device of claim 19, wherein said resonator assembly is formed directly on said surface of said second substrate.

21. The device of claim 20, wherein said resonator assembly comprises a resonator loop having any one of a loop configuration, a box configuration, a double-loop configuration, and a multi-folded loop configuration.

22. The device of claim 21, wherein said antenna assembly further comprising at least two antenna elements not in physical contact to one another and wherein each one of said antenna element includes one end that is capacitively coupled to said resonator loop.

23. An RFID device comprising:
an antenna assembly comprising a first substrate and at least one antenna element; and
a strap assembly overlaying and attached to the at least one antenna assembly, the strap assembly comprising:
a second substrate;
an integrated circuit coupled to the second substrate, wherein the integrated circuit comprises one or more contact pads; and
interconnections are coupled to the integrated circuit through the one or more contact pads, said interconnections being formed on a surface of the second substrate, and wherein the interconnections are substantially larger than the one or more contact pads;
wherein said antenna assembly is capacitively coupled to said integrated circuit without direct physical contact between the antenna elements and the integrated circuit through a non-conductive layer disposed between said at least one antenna element and said interconnection.

24. An RFID device comprising:
an antenna assembly comprising a first substrate and antenna elements; and
a strap assembly overlaying and affixed to said antenna assembly, the strap assembly comprising:
a second substrate;
a functional block having an integrated circuit thereon, the functional block being embedded within the second substrate and substantially flush with a surface of the second substrate, wherein the functional block and/or the integrated circuit comprises one or more contact pads, and wherein; and
interconnections are connected to the integrated circuit through one or more said contact pads, said interconnections being formed on said surface of said second substrate, and wherein the interconnections have areas substantially larger than areas of the one or more contact pads,
wherein said antenna elements capacitively couple to said interconnections without direct physical contact between the antenna elements and the integrated circuit through a non-conductive layer disposed between antenna elements and said interconnections.

25. A device comprising:

an antenna assembly comprising a first substrate and antenna, the first substrate being a product package; and a strap assembly overlaying and affixed to said antenna assembly, the strap assembly comprising a second substrate having an integrated circuit having one or more contact pads, and interconnections connected to the one or more contact pads of the integrated circuit, said interconnections being formed on a surface of said second substrate, and wherein the interconnections have areas substantially larger than areas of the one or more contact pads, wherein said antenna is inductively or capacitively coupled to said integrated circuit, without having direct electrically conductive contact between the antenna and the integrated circuit.

26. The device of claim 25 wherein the integrated circuit is embedded within the second substrate.

27. The device of claim 25 wherein the antenna is at least one of a screen printed metal, thick film silver, hot stamped foil, and thin film metal.

* * * * *